United States Patent [19]

Ikawa et al.

[11] Patent Number: 4,631,686
[45] Date of Patent: Dec. 23, 1986

[54] SEMICONDUCTOR INTEGRATED CIRCUIT DEVICE

[75] Inventors: Yasuo Ikawa, Tokyo; Tadashi Shibata; Kiyoshi Urui, both of Yokohama; Misao Miyata, Tokyo; Masahiko Kawamura, Yokohama; Noboru Amano, Tokyo, all of Japan

[73] Assignee: Kabushiki Kaisha Toshiba, Kawasaki, Japan

[21] Appl. No.: 646,121

[22] Filed: Aug. 31, 1984

[30] Foreign Application Priority Data

Aug. 31, 1983 [JP] Japan .................. 58-157718

[51] Int. Cl.$^4$ ............... H03K 19/173; H04Q 9/00
[52] U.S. Cl. .................. 364/490; 340/825.87; 340/825.91; 340/825.83
[58] Field of Search ............ 364/490, 488, 491, 300; 340/825.87, 825.91, 825.83

[56] References Cited

U.S. PATENT DOCUMENTS

| 3,818,452 | 6/1974 | Greer | 340/825.87 |
| 4,091,359 | 5/1978 | Rossler | 340/825.83 |
| 4,447,881 | 5/1984 | Brantingham et al. | 364/490 X |
| 4,523,106 | 6/1985 | Tanizawa et al. | 364/490 X |

FOREIGN PATENT DOCUMENTS 58-500096 1/1983 Japan .
2089160 6/1982 United Kingdom .

OTHER PUBLICATIONS

IBM Journal of Research & Development, vol. 19, No. 2, (Mar. 1975), H. Fleisher et al., "An Introduction to Array Logic", p. 98.
IEEE Transactions of Electron Devices, vol. ED-29, No. 4, (Apr. 1982), K. F. Smith et al., "Structured Logic Design of Integrated Circuits Using the Storage/Logic Array (SLA)," p. 765.
S. Muroga, "VLSI System Design", 1982, John Wiley & Sons, Inc., chapter 9, pp. 355–427.
IBM Technical Disclosure Bulletin, vol. 25, No. 3B, Aug. 1982; T. A. Larsen, "Circuit for Setting an Electronically Alterable FET in an Array for Controlling a Generalized Logic Circuit", pp. 1524, 1525.

Primary Examiner—Edward J. Wise
Attorney, Agent, or Firm—Oblon, Fisher, Spivak, McClelland, & Maier

[57] ABSTRACT

A programmable semiconductor integrated circuit device is disclosed, which includes different kinds of MSI scale function blocks formed on a substrate. First wiring lines extending in a row direction are connected to input terminals of the function blocks, respectively. Second wiring lines are connected to output terminals of the function blocks, respectively. The second wirings are T-shaped and have respective line components extending in a column direction, with the first wiring lines. Floating gate type field effect transistors are provided, in a matrix manner, at mutually electrically insulated crossing points among the first and second lines. The electrical state of the switching transistors can be set independently and changeably, under the control of row and column decoders, to specify a desired wiring pattern of the function blocks by having the shortest signal transmission paths of the first and second wiring lines through the hardware as in the case of a custom LSI, thereby realizing the desired custom-made LSI.

17 Claims, 28 Drawing Figures

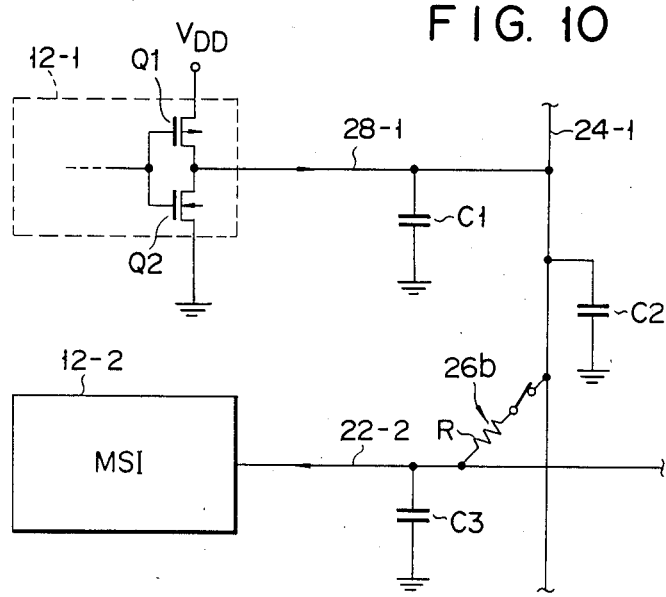
FIG. 10
FIG. 12
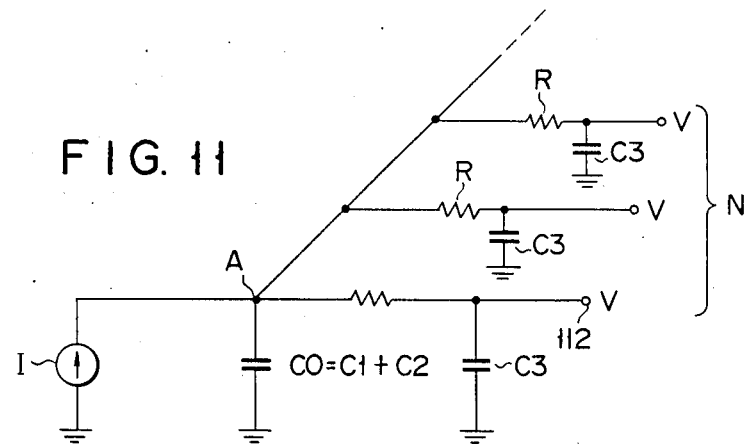
FIG. 11

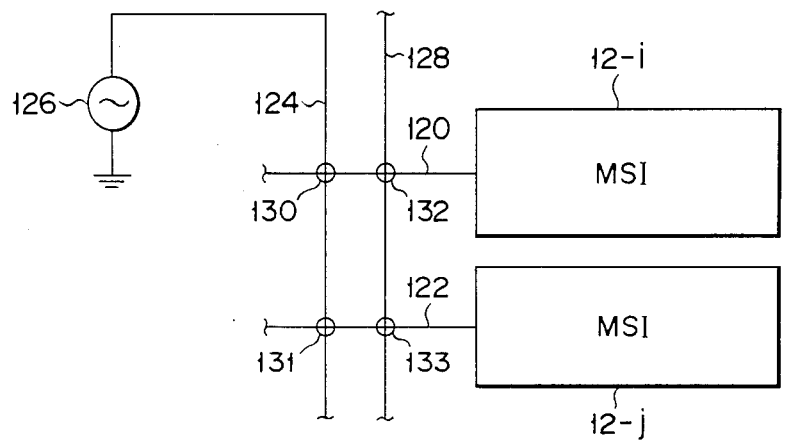
FIG. 13
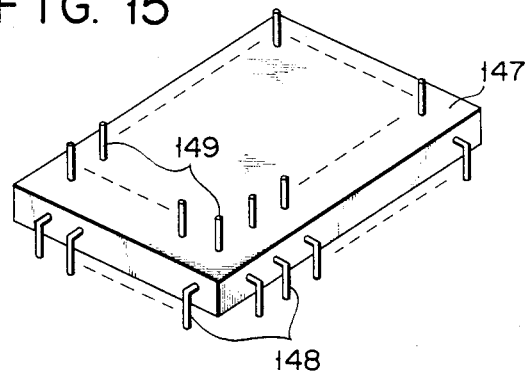
FIG. 15
FIG. 14
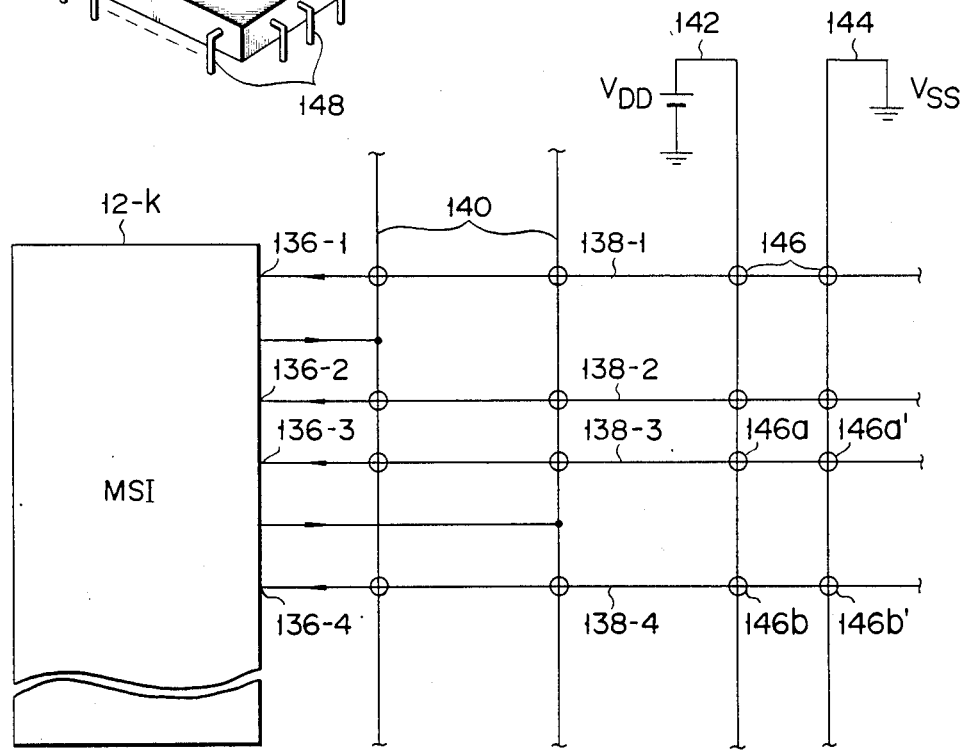

SEMICONDUCTOR INTEGRATED CIRCUIT DEVICE

BACKGROUND OF THE INVENTION

The present invention relates in general to semiconductor integrated circuits and, more particularly, to semiconductor integrated circuits which are manufactured such that they can be made to have the logic functions desired by customers.

The technology of semiconductor elements has been strikingly developed since the invention of the transistor by Dr. William Shockley and others at the Bell Laboratories in the U.S.A in 1948. The integrated circuits (ICs) which have a number of active elements or logic gates formed on one chip, have been revolutionized in the degree of integration, in operational speed and in their reliability, along with the rapid advancement in manufacturing techniques. By way of example, LSIs and VLSIs have been realized in which large-scale high-performance electronic circuit systems have been integrated on a square chip having a side with a dimension of only several millimeters.

In order to realize an LSI in which a desired electronic circuit such as a logic function circuit is integrated, there are basically two different approaches. The first approach is a custom LSI, in which an optimum exclusive logic circuit conforming to a desired design specification is realized on a semiconductor chip. To fabricate a custom LSI, CAD (computer-aided disign) techniques for designing an exclusive pattern are introduced in the circuit design. Thus, a functional chip which can operate at a high speed and has a high degree of integration can be produced. On the minus side, however, the custom LSI requires a long time to development, and it is difficult to change a specification once it is decided. Further, there is no guarantee that mass production is possible, which leads to a high risk on the part of the user as far as cost is concerned. Semi-custom-made LSIs are also well-known in the art, but they are not expected to totally overcome the deficiencies noted above. The second approach for realizing an LSI having a desired logic function is a microprocessor (or microcomputer). This approach integrates the usual computer function on one chip. The microprocessor thus can fulfill a wide variety of functions as desired under software program control. Thus, the same microchip can be used for a variety of different applications. This means that a microprocessor can meet the requirements to obtain a large number of different LSIs, each of which is manufactured only in small quantities, at low cost and in a comparatively short period of time. A disadvantage of this microprocessor is that its operational speed is far below that of the custom LSI noted above because the internal signal transfer is controlled by software. Therefore, the microprocessor is inevitably powerless, particularly when it is applied to a system where high operational speed is required.

Up to now, there has been no semiconductor IC or LSI which can meet the need for a variety of exclusive LSIs which can be manufactured only in small quantities by readily realizing desired functions and which are also superior in performance, particularly in operational speed. Of course, other approaches derived from the two basic approaches described above (e.g., the gate-array LSI, etc.) exist and are being advanced, but none of them can simultaneously meet the two requirements noted above.

SUMMARY OF THE INVENTION

It is therefore an object of the present invention to provide a new and improved semiconductor integrated circuit device, which permits a wider variety of logic function specifications to be readily realized on the user level.

It is another object of the present invention to provide a new and improved semiconductor integrated circuit device, which permits a wider variety of logic function specifications to be readily realized at the user level, and which includes an electric circuit configuration that conforms to a specified logic function and that can operate at a high speed comparable to that of the existing custom LSIs.

In the semiconductor integrated circuit device according to the invention, different kinds of functional elements are preliminarily formed on a semiconductor substrate. Each functional element has a given unit logic function, and also has at least one input terminal and at least one output terminal. First wiring lines are formed on the substrate over a wiring pattern area adjacent to the functional elements and extend in a first direction. These first wiring lines are each connected to the input or output terminal of each functional element. Second wiring lines are formed in the wiring pattern of the substrate so that they are electrically insulated from the first wiring lines and extend in a second direction crossing the first direction. These second wiring lines are each connected to the terminal of each functional element, other than the terminal to which each first wiring line is connected. The second wiring lines form first electrically insulated crossing points with the first wiring lines. First switching elements are each provided at each crossing point between the first and second wiring lines, and are connected to corresponding first and second wiring lines. The first switching elements each consist of an electrical member which can be changed at least once between conductive and nonconductive states. A wiring pattern make-up unit is connected to the switching elements. This unit supplies the electric signals necessary for setting the given electrical states of the switching elements. Thus, the user can obtain a customized specification by using the initial configuration of the device and by designating the corresponding wiring for the functional elements using the shortest signal transmission paths attainable by using the first and second wiring lines.

BRIEF DESCRIPTION OF THE DRAWINGS

The present invention can be best understood by reference to the accompanying drawings, in which:

FIG. 10 is a circuit diagram equivalently showing the parasitic capacitance components for the wiring lines of the programmable LSI;

FIG. 11 is a connection diagram modeling the circuit of FIG. 10 for analysis of the delay in the programmable LSI;

FIG. 12 is a plan view showing a modification of the switching FET which is used in the programmable LSI to improve its operational speed;

FIG. 13 is a connection diagram showing the arrangement of circuit which reduces the electric power consumption of the programmable LSI;

FIG. 14 is a connection diagram showing a wiring pattern with a switching matrix for a function block including a 4-input NAND gate;

FIG. 15 is a perspective view showing a package of the programmable LSI;

DETAILED DESCRIPTION OF THE PREFERRED EMBODIMENTS

Figure 1:
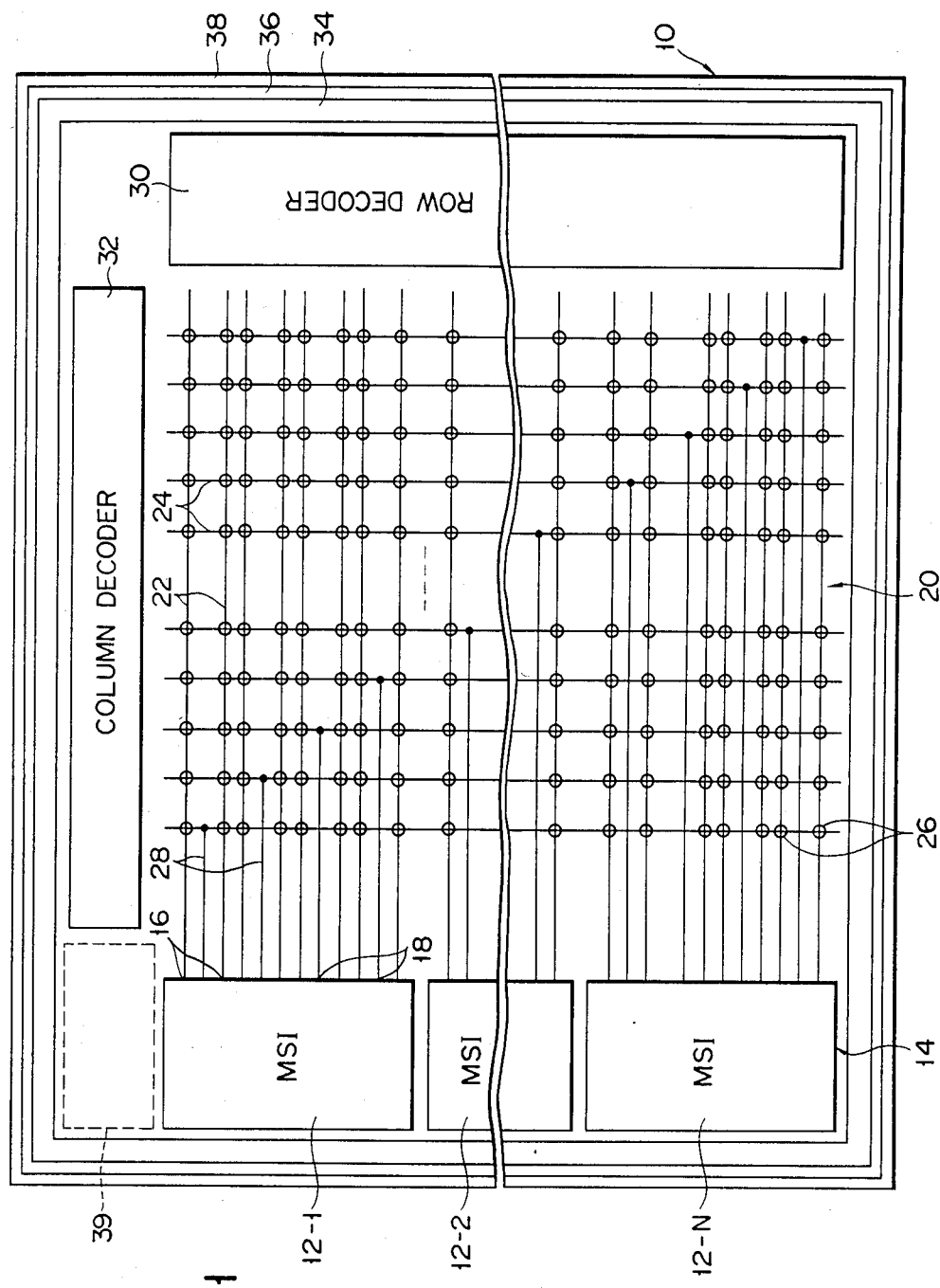
FIG. 1 is a plan view of a programmable LSI as a first embodiment of the invention.

Referring to FIG. 1, there is shown a plan structure model (not drawn to scale) of an LSI chip as a first embodiment of the invention. The surface area of the chip substrate 10 is divided into a plurality of areas. A plurality of function blocks 12-1 to 12-N (N=274, for example) is provided in a substrate surface area 14, for instance of 2,500μ by 8,000μ. The individual function blocks 12-1 to 12-N each have a function of a given unit circuit, and are formed by the existing technology for the manufacture of semiconductor integrated circuits, such as custom LSIs. They each correspond to about 50 gates. The chip 10, therefore, may be thought to be an array of MSIs each having a logic function corresponding to over 10 kilogates. In this embodiment, each function block has a greater number of signal input terminals than the number of output terminals. For example, they may average each eight signal input terminals 16 and four signal output terminals 18.

A wiring pattern is formed on the area of the chip surface 20 which is about 5,600×8,000 $\mu m^2$, and which is adjacent to the area 14 where the function blocks 12-1 to 12-N are formed. The wiring pattern consists of row signal lines (i.e., signal input lines) 22 coming from the signal input terminals 16 of the function blocks 12-1 to 12-N, and extending in the direction of the row and column signal lines (i.e., signal output lines) coming from the signal output terminals 18 of the function blocks and extending in the direction of the columns. These two different kinds of wiring lines 22 and 24 are electrically insulated from one another. Switching elements 26 are provided at the crossing points between the wiring lines 22 and 24. The given electrical connection of the signal input and output lines 22 and 24 may be obtained by designating the corresponding electrical states (i.e., conductive or nonconductive) of the individual switching elements 26. For instance, by making a switching element conductive, a corresponding signal input line 22 and a corresponding signal output line 24 may be connected to each other. A signal output from a given function block thus can be fed to a given input terminal of a different or of the same function block. In this embodiment, 1,600 by 800 switch elements are provided on the substrate 10 for 264 function blocks. Each signal output line 24 extending in the direction of the columns has a line 28 extending in the direction of the rows, i.e., parallel to the signal input lines 22. One signal output line, which crosses all the signal input lines 22, always has one perpendicular line 24. The perpendicular line 24 is electrically connected to the associated output line 24 in the form of a letter "T" without any switching element provided at the junction of the two lines. It should be noted that row and column decoders 30 and 32, which can set the electrical state (i.e., conductive or nonconductive of each of the switching elements) are formed adjacent to the wiring pattern area 20. Further, an input/output buffer, a power supply line area 34 (with a width of 200μ), a pad area 36 (with a width of 100μ), and a scribe area 38 (with a width of 100μ) are provided on the substrate 10 such that they surround the function blocks 12-1 to 12-N, wiring patterns 22, 24, and row and column decoders 30 and 32. A clock generator circuit (not shown) is formed in an area 39.

A specific example of the aggregate of function blocks in this embodiment is shown in the following table. There are provided 31 different kinds of function blocks which each have a CMOS configuration.

TABLE 1

| Kind of function block | Quantity |
| --- | --- |
| 1. Block having two 4-input NAND gates | 15 |
| 2. Block having four 2-input NAND gates | 14 |
| 3. Block having one 8-input NAND gate | 1 |
| 4. Block having four inverters | 100 |
| 5. Block of an 8-bit register | 19 |
| 6. Block having two D-type flip-flops | 19 |
| 7. Block having two 4-input AND gates | 17 |
| 8. Block having four 2:1 data selectors | 13 |
| 9. Block having two 4-bit binary counters | 11 |
| 10. Block having two 2-4 line decoders | 7 |
| 11. Block having a 3-8 line decoder | 3 |
| 12. Block having two 4-1 line selectors | 5 |
| 13. Block having an 8-1 line selector | 4 |
| 14. Block having 8-bit serial input parallel output shift register | 3 |
| 15. Block having 8-bit parallel input serial output shift register | 3 |
| 16. Block having 8-bit serial input serial output shift register | 2 |
| 17. Block having two monostable multivibrators | 4 |
| 18. Block having four 2-input OR gates | 4 |
| 19. Block having four 2-input NOR gates | 3 |
| 20. Block having two AND-OR inverters | 3 |
| 21. Block of a 64-bit RAM | 3 |
| 22. Block having four 2-input exclusive OR gates | |
| 23. Block of a 4-bit comparator | 3 |
| 24. Block having two J-K flip-flops | 4 |
| 25. Block of a 9-bit even/odd parity generator/checker | 3 |
| 26. Block of a 4-bit binary full adder | 2 |
| 27. Block having four 2-input multiplexers | 5 |
| 28. Block having four S-R latches | 2 |
| 29. Block of an ALU | 7 |
| 30. Block of an 8-bit addressable latch | 3 |
| 31. Block of a look-ahead carrier generator | 5 |

Figure 2:
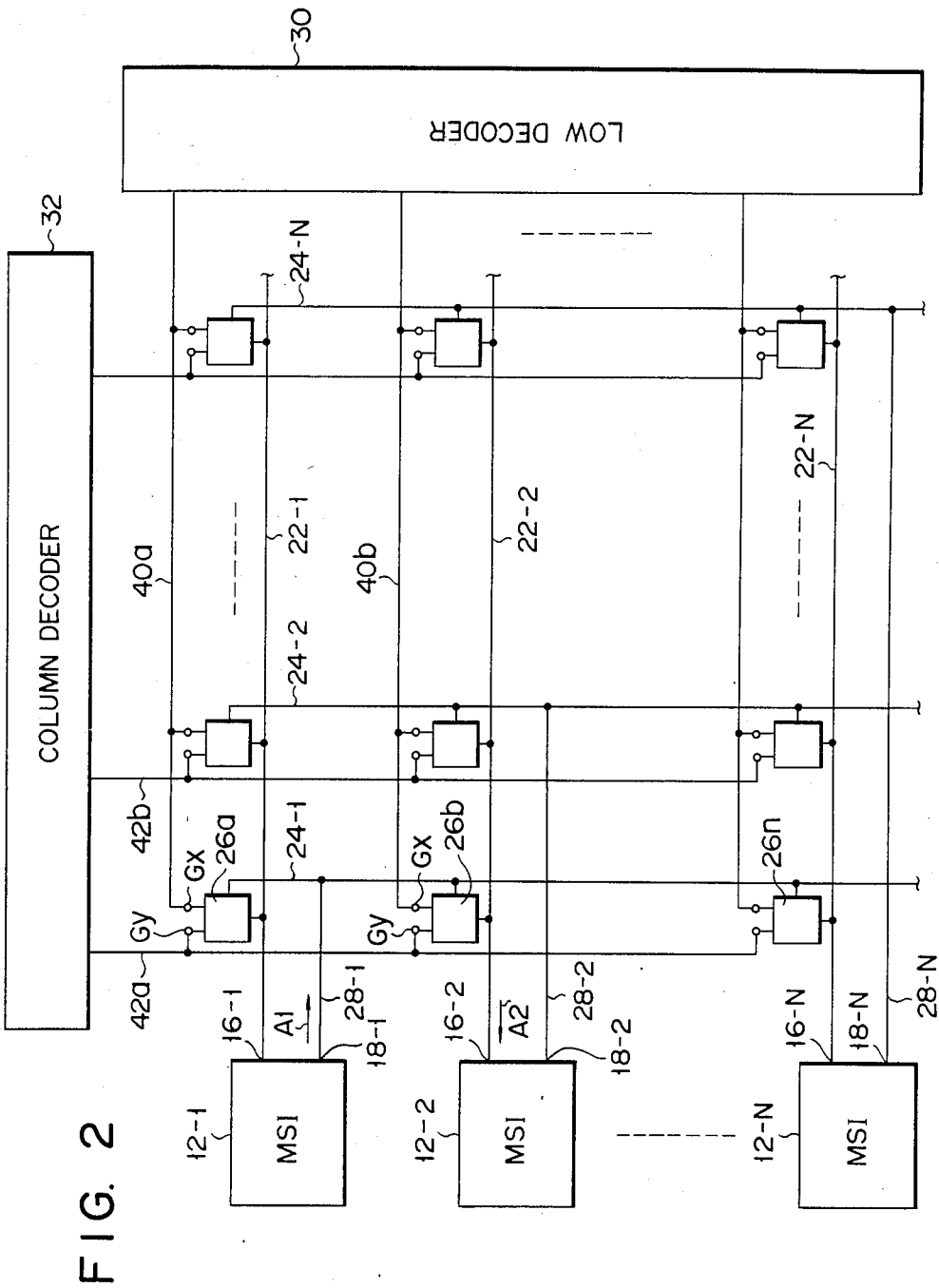
FIG. 2 is a connection diagram modeling the configuration of a circuit of the programmable LSI, including MSI function blocks and the wiring pattern connected thereto.

FIG. 2 is a connection model diagram for describing the chip configuration of FIG. 1 in greater detail. In the figure, each function block is shown simplified such that only a single signal input line and a single signal output line lead from it to facilitate the explanation of the concept of the invention. In the configuration of FIG. 2, the individual switching elements 26 which are provided in a matrix array at the crossing points between input lines 22-1 to 22-N and signal output lines 24-1 to 24-N consist of normally-off MOSFETs. Each MOSFET has two (i.e., first and second) control gates Gx and Gy connected to the row and column decoders 30 and 32, respectively, as shown in FIG. 2. Each MOSFET 26 is rendered conductive when ON command signals (of logic level "1", for instance) are simultaneously fed from the decoders 30 and 32 to its first and second control gates Gx and Gy. As an example, when the output terminal 18-1 of the first function block or MSI 12-1 is to be electrically connected to the input terminal 16-2 of the second MSI 12-2, the decoders 30 and 32 simultaneously generate respective signals of logic level "1", which are fed through control lines 40b and 42a to the first and second control gates Gx and Gy of the FET 26b which is nonconductive under a non-biased state. As a result, the FET 26b is rendered conductive. Now, the output signal from the output terminal of the MSI 12-1 is transmitted to the input terminal of the intended MSI 12-2 through the conductive FET 26b as shown by arrows A1 and A2. In this situation, the rest of the FETs are either in a nonselected or half-selected state and are hence nonconductive, so that the output signal from the MSI 12-1 is never transmitted to any other MSI than the intended MSI 12-2.

Figure 3:
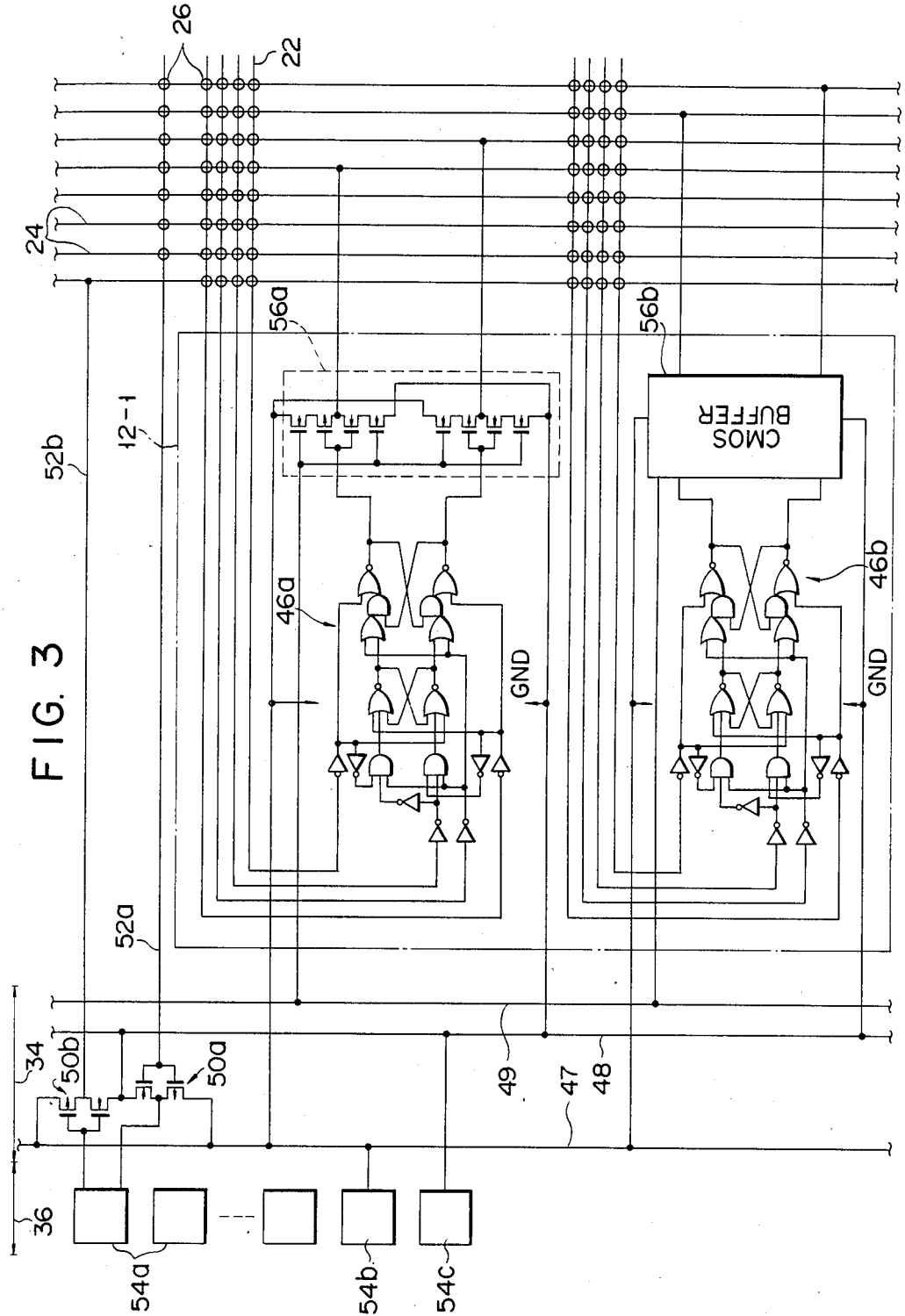
FIG. 3 is a connection diagram showing the configuration of the inner circuit of the MSI function blocks formed on the LSI.

FIG. 3 illustrates the MSI 12-1 as a typical MSI in the chip arrangement of FIG. 1 and a peripheral circuit arrangement in a greater detail. In the figure, the portion enclosed by a dashed rectangle, including two D-type flip-flops 46a and 46b, corresponds to the MSI 12-1 shown in FIG. 1. A power supply line 47 (at $V_{DD}$), a ground line 48 and a clock signal line 49, along which a clock signal used as a synchronizing clock or a system clock is transmitted, are formed in the input/output buffer and power supply line area 34. Output and input buffers 50a and 50b which consist of CMOS transistors, are formed between lines 47 and 48. An input line 52a connected to the output buffer 50a, is capable of being connected to the lines 24 through switching elements capable of on-off control in the same manner as the signal input lines 22 leading to the MSI 12-1. An output buffer line 52b leading from the input buffer 50b has a letter "T" wiring line like the lines 28 noted above. No switching element FET is provided at the crossing point between the two buffer lines 52a and 52b. Pad patterns 54 which are connected to the external wiring, are provided in the pad area 36. Among these pad patterns, a pad pattern 54b serves as a power supply pad, and a pad pattern 54c serves as a grounding pad. Buffer sections 56a and 56b are provided after the respective flip-flops 46a and 46b. They consist of CMOS transistors which are operated in response to the clock signal transmitted along the clock line 49.

Figures 4, 5:
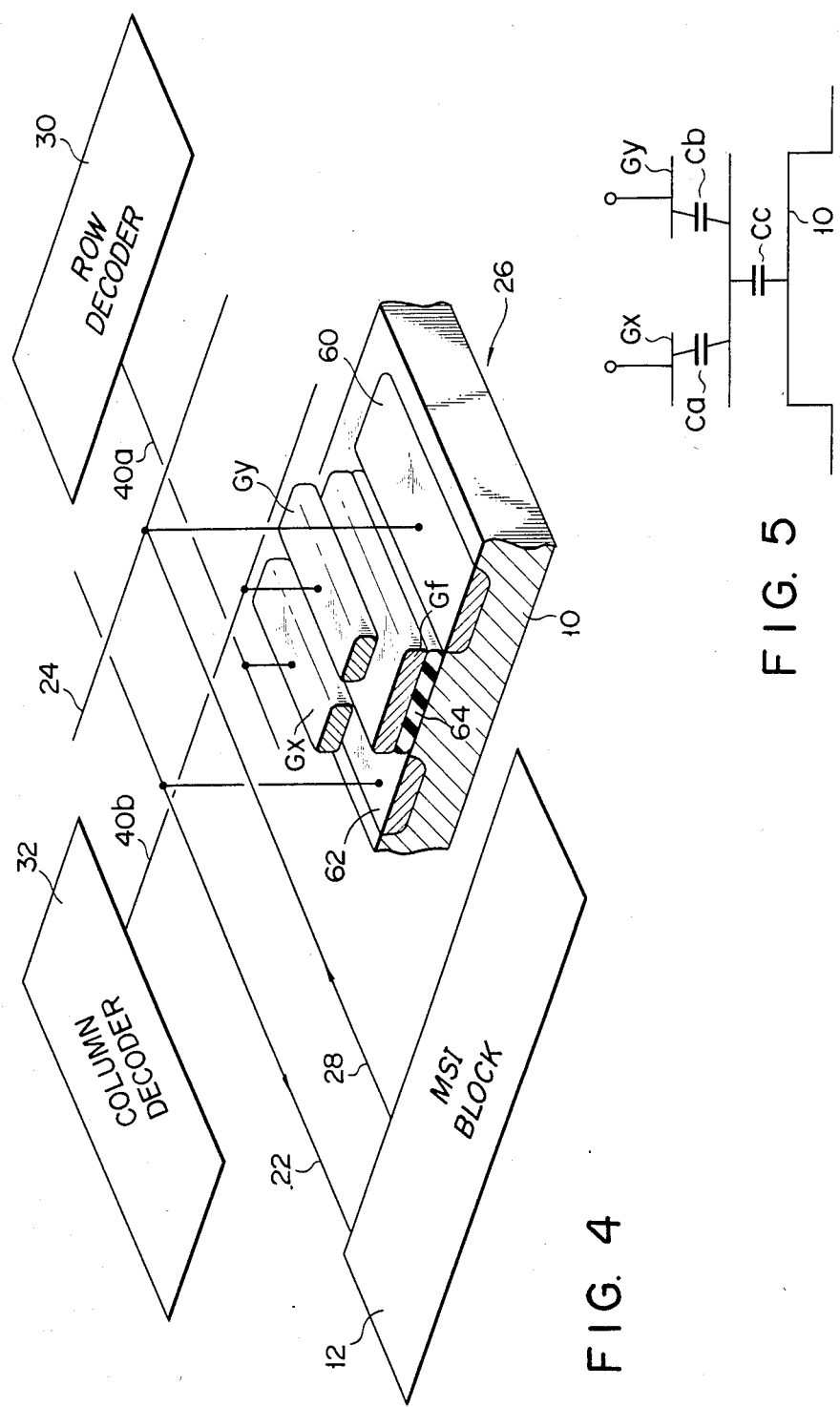
FIG. 4 is a pictorial perspective view showing one switching element which is included in the wiring pattern and which serves as a switching element.
FIG. 5 is an equivalent circuit diagram of the switching FET having parasitic capacitance components.

FIG. 4 illustrates a model of the normally-off MOSFET with two control gates, which constitutes a switching element in the matrix array provided in the chip arrangement. In this embodiment, the MOSFET 26 has n+-type source and drain 60, 62 formed in a p-type silicon substrate 10. It also has a floating gate Gf, which is formed above its channel region and which is insulated from the source and drain regions 60 and 62 by a thin insulating layer 64. Its first and second control gates Gx and Gy are formed above the floating gate Gf such that they are insulated from the gate Gf by respective SiO$_2$ layers (not shown). The gates Gf, Gx and Gy are formed from polycrystalline silicon layers in lamination. The thin insulating layer 64 is a silicon oxide film approximately 100 Å thick serving as a tunnel oxide film. A letter "T" signal output line 28 from one of the MSIs is connected to the source 60 of the FET 26, while a signal output line 22 of another MSI is connected to the drain 62 of the FET 26. With this type of MOSFET 26, the current flowing through the channel, i.e., a substrate region right under the SiO$_2$ film 64, can be controlled by controlling the potential on the floating gate Gf. FIG. 5 shows an equivalent circuit of the MOSFET 26 shown in FIG. 4. A capacitance Ca is present between the floating gate Gf and first control gate Gx. A capacitance Cb is present between the floating gate Gf and second control gate Gy. A capacitance Cc is present between the floating gate Gf and substrate 10. In the ordinary MOSFET structure, the capacitances Ca, Cb and Cc are related as $$Ca \simeq Cb,$$

and $$Cc \simeq Ca + Cb.$$

The operation of the floating gate MOSFET 26 will now be described with reference to FIGS. 4 and 5. When the potential on the first and second control gates Gx and Gy of the FET 26 is set to 20 V and the potential on the substrate 10 is set to 0 V, the potential on the floating gate Gf is approximately 10 V due to the capacitances Ca, Cb and Cc. The floating gate Gf and substrate 10 extend in close proximity to each other and are electrically insulated from each other by the SiO$_2$ film 64 which is approximately 100 Å in thickness. The potential difference of approximately 10 V between the floating gate Gf and substrate 10 causes a tunnel current through the thin SiO$_2$ film 64. Electrons are thus injected from the substrate 10 into the floating gate Gf. When the potential on either or both of the first or second control gates Gx and Gy is subsequently reduced to 0 V, the floating gate Gf is charged to a negative potential due to the injected electrons noted above. At this time, the threshold voltage Vth on the floating gate Gf is approximately 10 V, and the FET 26 remains nonconductive. It will be understood that when the substrate potential is 0 V, the FET 26 is nonconductive (which corresponds to an off state when the FET serves as a switch) irrespective of the potential on the first and second control gates Gx and Gy. This state means that data representing this OFF state has been written in the FET switch. With the change of the potential on either or both of the first and second control gates Gx and Gy to 0 V, no tunnel current is caused, and hence the electrical state of the FET switch is not inverted.

When the potential on both the control gates Gx and Gy is set to 0 V and the potential on the substrate 10 is set to 20 V as a second operation mode of the FET, the isolation between the function blocks (i.e., MSIs) and switch matrix area 20 is attained by p-n junction separation. For example, a first n-type well is formed in a solitary area of the p-type silicon substrate 10 in which the function blocks are formed. A first p-type well is formed in the first n-type well, and the function blocks are formed in the p-type well. Of the CMOSs of the function blocks, the p-channel MOSFETs are formed in a second n-type well which is formed in the first p-type well. The potential on the second n-type well is set to V$_{DD}$, and the potential on the first p-type well is set to V$_{SS}$. The first n-type well is set to +20 V or to the floating state when the substrate 10 is set to +20 V by the operation of the switch matrix area 20, and the well is set to 0 V or to the floating state when the substrate 10 is set to 0 V. As an alternative, an air isolation may be provided by using an SOS (silicon-on-sapphire) substrate and by forming a groove between the function blocks and switch matrix area 20. As a further alternative, an insulating film may be buried for isolation.

Figure 6A:
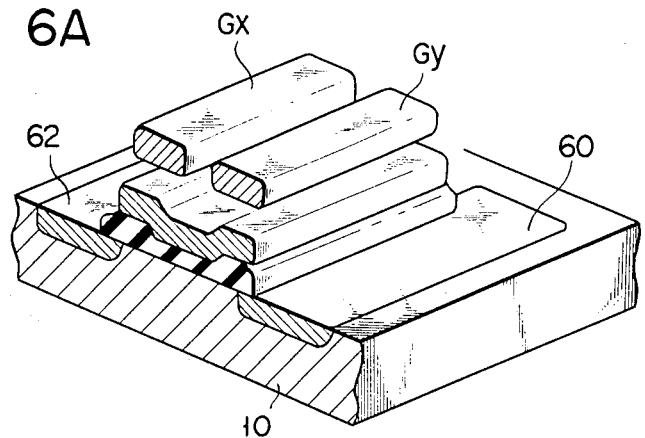
FIGS. 6A to 6C are pictorial perspective views showing some modifications of the switching FET shown in FIG. 5.
Figure 6B:
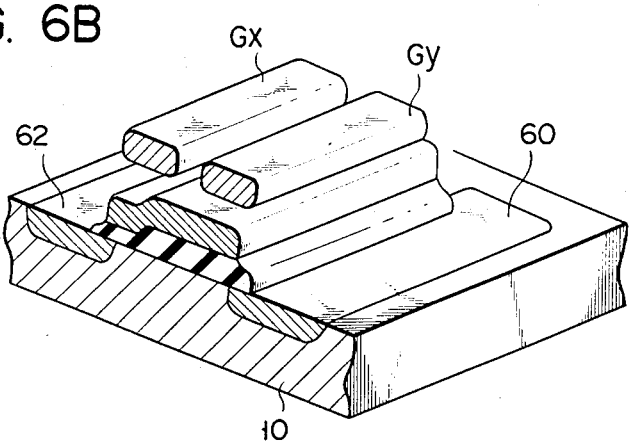
Figure 6C:
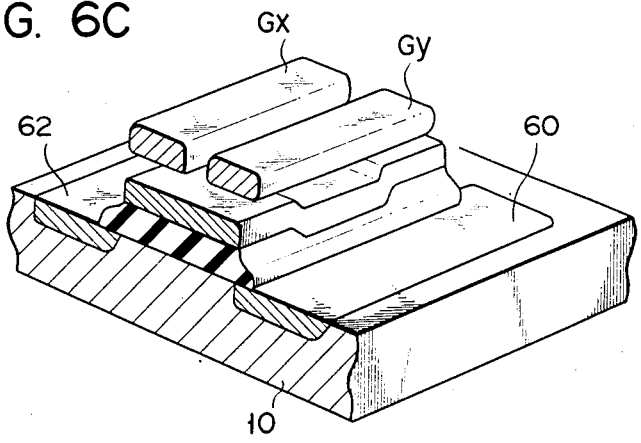

When the substrate potential is set to 20 V, the floating gate Gf is held at a potential of approximately 10 V. As a result, a tunnel current is caused through the SiO$_2$ film 64, causing the electrons stored in the gate Gf to be discharged to the substrate 10. Even if the potential on either or both of the first and second control gates Gx and Gy is changed to 20 V or 0 V at this time, the FET 26 will keep its conductive state (the threshold voltage Vth of the FET at this time being approximately $-10$) because the floating gate Gf has been charged to a positive potential. Further, if the potential on at least one of the first or second control gates Gx or Gy is 20 V, no tunnel current will flow causing the electrical state of the FET switch to not be inverted. Furthermore, the inversion of the electrical state of the FET from the conductive state (ON) will not occur if the negative potential on both the control gates Gx and Gy is set while maintaining the potential on the substrate 10 at 0 V. In general, once the substrate potential is set to 0 V and the potential on both the control gates Gx and Gy is set to a potential lower than 10 V, for instance, after the FET switch has been turned ON or OFF, the electrical state of the FET switch will never undesirably change. To prevent the electrical state of the FET from undesirably changing, it is also possible to set the potential on both the control gates Gx and Gy to 0 V or to have the supply voltage of the circuit (which is no higher than 5 V, for instance). When the control gate potential is set to the supply voltage, the potential on the floating gate Gf is increased so that the resistance of the on FET switch may be reduced as compared to the case where the control gate potential is set to 0 V. This fact contributes to a decrease in the delay of signal transmission due to the resistance of the switch section itself. It should be noted that the oxide film (i.e., SiO$_2$ film) 64 right under the floating gate Gf of the FET 26 shown in FIG. 4, need not be formed over the entire channel region in the substrate 10 between the source and drain. Further, the oxide film under the floating gate Gf may be formed such that it has a reduced thickness which serves as a tunnel oxide film. The reduced thickness of the oxide film may be formed such that: (1) it extends parallel to the source and drain, and over the channel region, (2) it extends parallel to the drain at the junction between the channel and drain, or (3) it is a narrow strip transversing the source and drain. FIGS. 6A to 6C show models of the shape of the floating gate in the cases (1) to (3), respectively. The reduction of the area of the tunneling oxide film in these ways, does not only improve the manufacturing yield of thin film transistors on the chip but also reduces the coupling capacitance between the floating gate Gf and substrate 10. Reducing this coupling capacitance permits increasing the coupling capacitance between the control gates Gx, Gy and floating gate Gf enough to permit an improvement of the write/erase characteristic (i.e., the ON-/OFF control characteristic) of the FET switch 26.

The internal construction of the function blocks in the present embodiment will now be described. Generally, a function block may be set desirably to suit a given condition.

The construction of the function blocks depends on what kind of logic functions are to be provided in the entirety of the chip. In some cases, a large number of memories is desired. In other cases, a large number of ALUs (arithmetic and logic units) is desired. Manufacture of the chip, however, imposes limitations on the total number of logic gates of the functon blocks, and on the total number of signal input and output lines. When what is called the "1 μm rule" is adopted as the pattern layout rule in the manufacture of the semiconductor integrated circuit device, and when the substrate chip size is set to be 10 mm by 10 mm, the total number of gates is 10,000 and the MSIs on a 50-gate scale are adopted as the function blocks. Assuming that each function block in this case is associated with 8 signal input lines and 4 signal output lines, the total number of the signal input and output lines is respectively 1,600 and 800 (assuming that 200 function blocks are integrated). In order to be able to realize every possible electrical connection between the signal input and output lines 1,280,000 (i.e., 1,600×800) FET switches 26 are necessary in the wiring pattern area 20 as shown in a simplified fashion in FIG. 2. To this end, the size of the wiring pattern area 20 in FIG. 1 may be set to be 5.6 mm by 8 mm, while the size of the function block section area may be set to 2.5 mm by 8 mm. In this case, the size of the row decoder 30 is set to be 8 mm by 1 mm, and the size of the column decoder 32 is set to be 5.6 mm by 1 mm.

Figure 7:
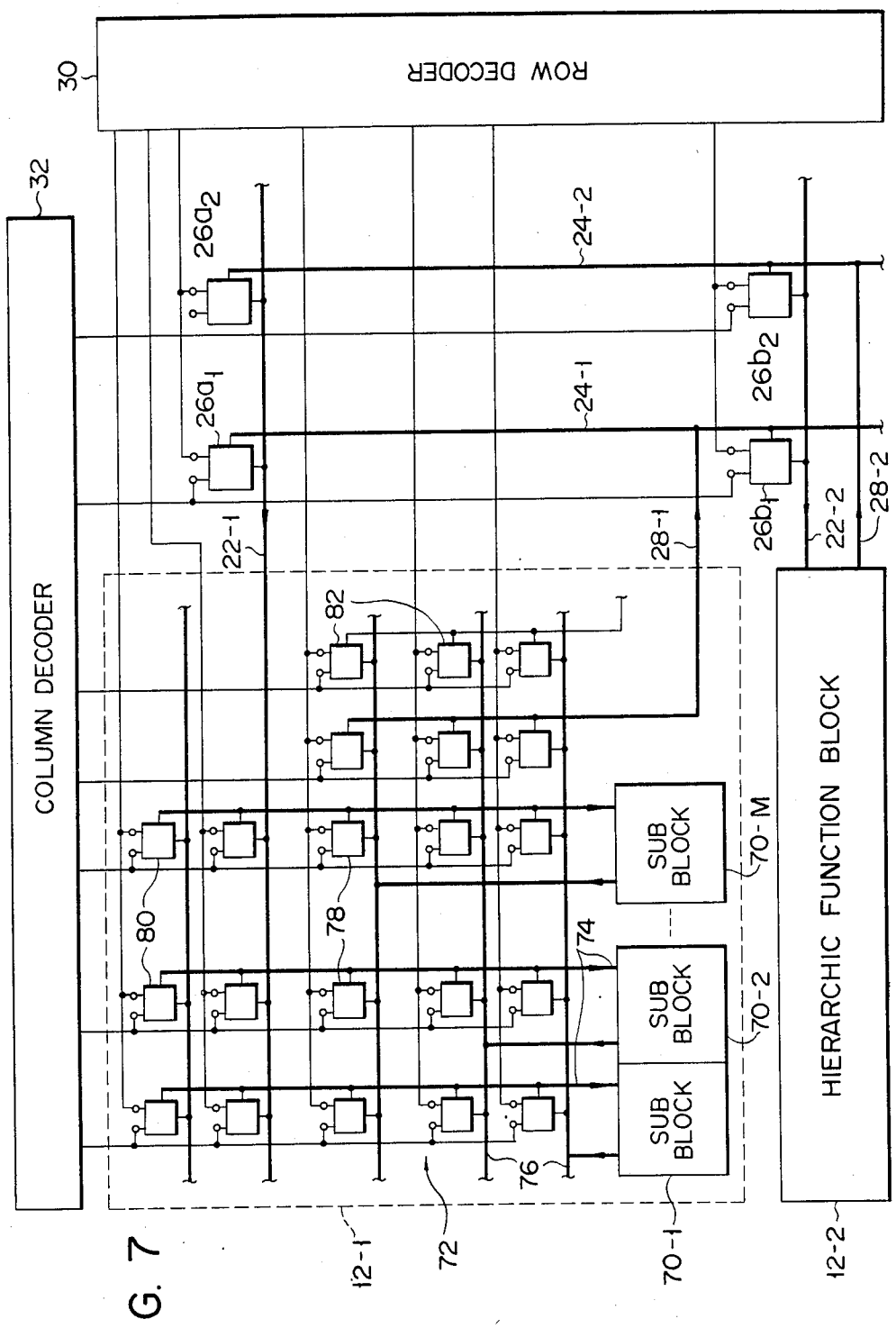
FIG. 7 is a connection diagram showing the configuration of the inner circuit of the hierarchic function block.

In the programmable LSI of this embodiment, each function block may have an own internal changeable wiring matrix consisting of sub-switching FETs, as shown in FIG. 7. More specifically, each function block, as shown in FIG. 7, includes a plurality of sub-blocks 70-1, 70-2 . . . 70-M and a switch matrix 72 which can changeably set the signal input/output relationship among these sub-blocks. In FIG. 7, the signal input and output lines are shown by bold lines while the control signal lines for switching the FETs are shown by fine lines for the sake of convenience.

The function block shown in FIG. 7, which is typically the function block 12-1, has a plurality of (e.g., 8) sub-blocks 70-1, 70-2 . . . 70-M. Usually, the sub-blocks 70-1, 70-2 . . . 70-M substantially correspond to the respective MSIs 12-1, 12-2 . . . described before in connection with FIG. 1. But the MSIs of FIG. 1 may each consist of a plurality of sub-blocks. The sub-blocks 70-1, 70-2 . . . are connected to the changeable wiring pattern substantially in the same manner as described before in connection with FIG. 2. In the area of the function block 12-1, signal input lines 74 leading to the signal input terminals of sub-blocks 70 and T-shaped signal output lines 76 connected to the output terminals of the sub-blocks cross one another at right angles, and switching MOSFETs 78 are each provided at each of the crossing points. The number of signal input lines 74 is 200, while that of signal output lines 76 is 100 in this embodiment. The FETs 78 have the same construction as the FET 26 shown in FIGS. 4 and 5. The first and second control gates of the FETs 78 are connected to the row and column decoders 30 and 32, and the electrical states of the given switching FETs can be changeably set under the control of the decoders 30 and 32. The signal input lines 74 of the sub-blocks 70-1, 70-2 . . . cross the signal input line 22-1 of the function block itself. Switching MOSFETs 80 are provided at the crossing points between these signal input lines 74 and 22-1. Likewise, the signal output lines 76 of the sub-blocks cross the signal output line 28-1 of the function block itself, and switching MOSFETs 82 are provided at the crossing points between the output signal lines 76 and 28-1.

In the function blocks 12-1 to 12-N (e.g., N=8), predetermined unit digital logic circuits, such as 4-input NAND gates, inverters, 8-bit registers, D-type flip-flops, 4-input AND gates, 2:1 data selectors, 4-bit binary counters, 2-4 line decoders, . . . are uniformly distributed. In other words, each function block includes substantially an equal number of unit digital logic circuits. As an example, all of the unit digital logic circuits shown in Table 1, such as 4-input NAND gates, inverters and 8-bit registers . . . , were distributed for the individual, first to eighth function blocks 12-1 to 12-8. For example, to distribute 400 inverters to the first to eighth function blocks 12, 50 inverters were each given to each of the function blocks 12-1 to 12-8. Thus, the sub-block 70-1 consists of 50 inverters. Next, to distribute 56 NAND gates (2-input NAND gates), seven NAND gates were given to the function blocks 12-1 to 12-8, respectively. Thus the sub-block 70-2 consists of seven 2-input NAND gates. The function blocks which are constituted in this way are hereinafter referred to as "hierarchic function block". The aforementioned arrangement which includes hierarchic function blocks permits the number of necessary switching FETs to be reduced. Further, the ON-conductance of the switching FETs $26a_1$, $26a_2$, $26b_1$, $26b_2$ can be made smaller than that of the switching FETs 78, 80, 82.

A hierarchic function block having a desired function can be realized by changeably setting the electrical state (i.e., the conductive or nonconductive state) of the switching FETs in each initial hierarchic function block. Thus the number of switching FETs can be reduced. In this embodiment the switching FETs $26a_1$ and $26b_2$ may be removed, since the signal output line 24-1, 24-2 of the hierarchic function blocks 12 need not be connected to the signal input line 22-1, 22-2 of the same block. Therefore, the number of switching FETs necessary for permitting every possible electrical connection of the hierarchic function blocks to one another in the case where there are 8 hierarchic function blocks is $\{(8-1)\times 10\}\times(8\times 5)$. In this case, 10 input lines and 5 output lines, for example, are provided for each hierarchic function block. Consequently, the total number of switching FETs that have to be provided on the chip in this case is:

$$\{(100+10)\times(200+5)-10\times 5\}\times 8+\{(8-1)\times 10\}\times(8\times 5)=182,80-0.$$

This number of switching FETs is roughly one-seventh of the number of switching FETs thought to be necessary in the simple consideration noted before.

Figure 8:
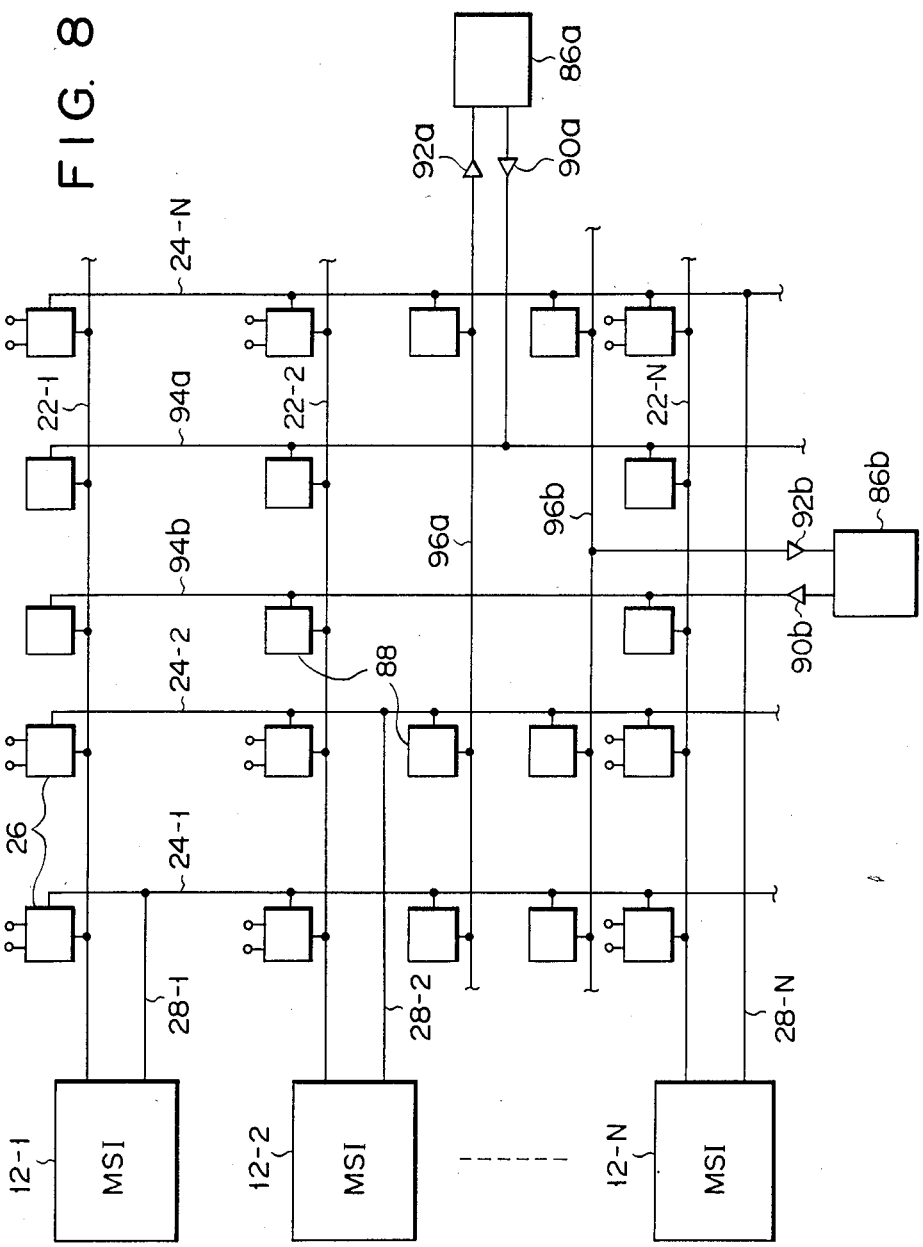
FIG. 8 is a connection diagram showing the electrical connection of pad patterns added to the wiring pattern of the programmable LSI.

Now, the arrangement of that part of the programmable LSI of the embodiment that concerns the transfer of signals with respect to the external circuitry will be described. FIG. 8 is a model circuit diagram corresponding to FIG. 2 which shows the connection between the pad patterns provided for wiring to the external circuitry and the switch matrix described above. Referring to FIG. 8, there are shown pad patterns 86a and 86b, which are regarded as one function block, the wiring lines of which cross the signal input and output lines 22 and 24 of the individual regular function blocks 12-1 to 12-N. Additional switching FETs 88 are provided at the crossing points between these lines. It is to be noted that, with the arrangement of FIG. 8, there is no initial specification as to whether the pad patterns 86a and 86b are for the input of signals from or for the output of signals to the external circuitry (not shown). In other words, the pad patterns 86a and 86b may be used either for the input of signals or for the output of signals. For this reason, the pad patterns 86a and 86b are provided with respective signal input buffers 90a and 90b and with signal output buffers 92a and 92b. The pad pattern 86a is one of the pad patterns that are provided in the area 36 of the chip of FIG. 1 and which are aligned in the direction of the columns. It is connected through the input buffer 90a to a corresponding T-shaped signal input line 94a. The T-shaped signal input line 94a crosses the signal input lines 22-1 to 22-N of the function blocks 12-1 to 12-N. Switching FETs 88 are provided at the crossing points between the lines 94a and 22-1 to 22-N. The pad pattern 86a is also connected through the output buffer 92a to a corresponding signal output line 96a. The signal output line 96a crosses the signal output lines 24-1 to 24-N of the function blocks 12-1 to 12-N. Switching FETs 88 are provided at the crossing points between the lines 96a and 24-1 to 24-N. The pad pattern 86b is one of the pad patterns that are provided in the area 36 and which are aligned in the direction of the rows. It is connected through the input buffer 90b to a corresponding signal input line 94b which crosses the signal input lines 22-1 to 22-N of the function blocks 12-1 to 12-N and the signal output line 96a noted above. Switching FETs 88 are provided at the crossing points between these lines. No FETs, however, are provided at the crossing points between the pad lines. This is because no signal can be directly transferred between pad patterns. This, however, does not mean that it is physically impossible to provide FETs at the crossing points between the pad lines; switching FETs may be provided at these crossing points if necessary.

Figure 9:
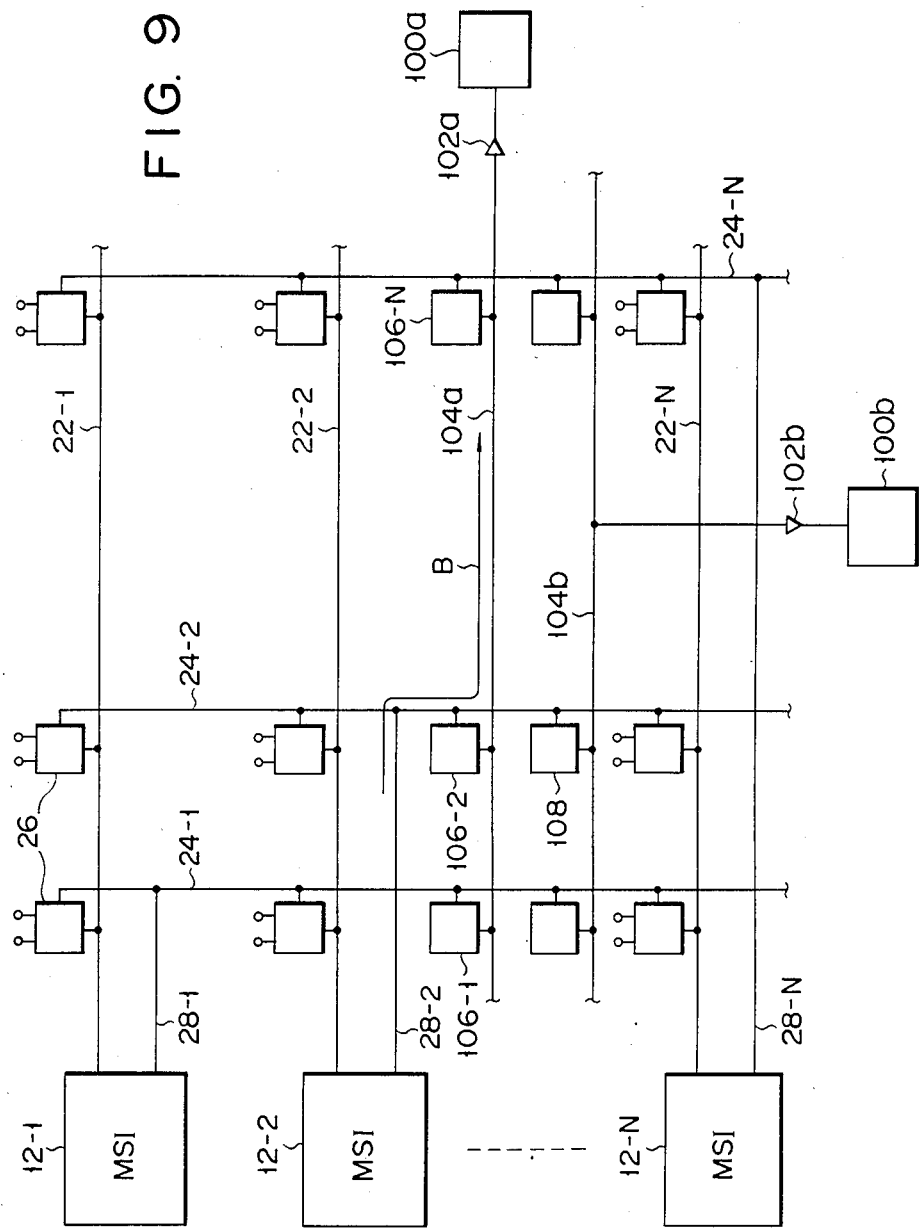
FIG. 9 is a connection diagram showing the electrical connection of pad patterns added in addition to the pad patterns shown in FIG. 8 to the wiring pattern of the programmable LSI.

As shown in FIG. 9, the pad patterns 86a and 86b are added to the wiring matrix wiring the MSIs, so that they can be used for either the input or output of signals as desired. However, it is possible to provide pad patterns 100a and 100b exclusively for the output of signals as shown in FIG. 9. The pad pattern 100a is one of the pad patterns exclusively used for the output of signals, which are aligned in the direction of the columns. It is connected through an output buffer 102a to a signal output line 104a. Switching FETs 106-1 to 106-N are provided at the crossing points between the signal output line 104a and the signal output lines 24-1 to 24-N of the MSIs. The pad pattern 100b is one of the pad patterns exclusively used for the output signals, which are aligned in the direction of the rows. It is connected through an output buffer 102b to a T-shaped signal output line 104b. Switching FETs 108-1 to 108-N are provided at the crossing points between the signal output line 104b and the signal output lines 24-1 to 24-N of the MSIs. The switching FETs 106-1 to 106-N, and 108-1 to 108-N are also set to be conductive or nonconductive under the control of the decoders 30 and 32. In the arrangement of FIG. 9, when the switching FET 106-2 is set to be conductive, the output signal from the MSI 12-2 is transmitted through this conductive FET 106-2 and the output buffer 102a to the pad 100a. In this case, the waveform of the output signal from the MSI 12-2 may be observed by monitoring the pad 100a. Generally, the waveform of the output signal from any desired MSI may be observed by selecting a corresponding FET. This means that the observation of the output signal waveform can be carried out inside the LSI chip substantially in the same manner as the output signal waveform observation carried out at a desired pin of an IC device assembled on an ordinary printed circuit board by having a probe of an oscilloscope or a logic analyzer in contact with that pin. Further, if there is a problem in the logic operation of the LSI chip being programmed so that it becomes necessary to change the wiring of the function blocks, the software program may be changed so as to change the pattern of control signals generated from the decoders 30 and 32, thereby changing the pattern of the physical wiring. Subsequently, the final desired logic operation can be confirmed through a signal waveform check like that described above. Thus, it is possible to easily test and logically debug actual devices. This is one of the most important features of the invention.

The output buffer 102a or 102b is constructed as an FET source follower or as a two-stage inverter in order to permit not only monitoring at the logic level but also to permit observation of the actual signal waveform on signal lines. The source follower type output buffer has a high input impedance and a low output impedance. The two-stage inverter output buffer is suited for monitoring at the logic level.

The number of pad patterns to be formed on the programmable LSI depends on the special redundancy of the LSI chip. As an example of the chip layout shown in FIG. 1, the size of each pad was set to 100μ by 100 μ, and the distance between adjacent pads was set to 100 μ. Therefore, about 400 pads can be provided. In this case, about 300 pads can be made available for the input and output of signals with respect to the external circuitry, the rest of the pads being necessary for common signal systems such as decoder systems, power source systems and a clock system. Actually, the number of pads is further reduced due to the limitations of chip packaging techniques. In the example noted, 200 signal input and output pads and 16 signal monitoring pads were provided.

It is a concept of the invention that the LSI chip of the above configuration is manufactured as a common chip by a semiconductor manufacturer and can be converted on the user side to a great variety of exclusive LSIs conforming to desired specifications with the desired LSI functions freely set by the users. The user, e.g., a logic designer, may obtain a desired exclusive LSI from the common chip by designating the electrical state of the individual switching FETs in the matrix array assembled on the chip to provide for a corresponding wiring (i.e., signal input and output relation) of a plurality of SSI or MSI scale function blocks which is also assembled on the chip. The electrical state of the switching FETs can be changed at any time as desired. Thus, the function of the exclusive LSI can be flexibly changed again (or any number of times if necessary) when it becomes necessary to change the logic function partly or entirely after the exclusive LSI has once been obtained. The operation of designating the electrical (i.e., conductive or nonconductive) state of the individual switching FETs changes according to the software by using the row and column decoders 30 and 32. More specifically, an exclusive LSI which has once been obtained from the LSI configuration of FIG. 1 can be changed or transformed into one conforming to an entirely different specification by merely changing the software which designates the wiring pattern of the set of MSIs or function blocks. It is to be noted that the software program specifying an exclusive LSI is utilized only for designating high or low level signals that are to be generated from the row and column decoders 30 and 32 to fully select the necessary FET or FETs and to set it or them to be conductive, thereby realizing the desired wiring of the MSIs. The software has no bearing on the execution of the internal logic functions of the LSI, unlike the conventional microprocessor chip. Once the wiring pattern of the individual function blocks has been set, the chip will execute the specified functions of the hardware as signals are actually transferred within the LSI. Thus, logic and arithmetic operations can be executed at speeds higher than the operational speeds of software-based microprocessors or microcomputer chips that are comparable with those of the conventional equivalent custom-made LSIs.

Further, as regards the manufacture of semiconductors, the hardware of an LSI chip having MSIs and a switch matrix, which may be called a master chip and which is used commonly to obtain a great variety of specifications, can be manufactured in large quantities. This contributes to a reduction in cost and in the time needed to develop the exclusive LSIs required by the software of the user as described earlier. The concept of master chip has been adopted in the known gate-array type chips (or semi-custommade LSIs). In this case, however, masks for wiring patterns to be added to the master chip must be designed and manufactured, which require time and money. In addition, in order to change a wiring pattern mask mold once it is produced, a new mask mold must be produced. In contrast, with the programmable master LSI chip, according to the invention, the semiconductor manufacturer need not produce any wiring pattern mask at all. In addition, an equivalent process can be readily executed, and changed any number of times according to the software of the user by designating the electrical state of the individual switching FETs from the decoders 30 and 32 as described earlier. This feature of the invention sets it apart from the prior art LSI chip gate-arrays. The invention thus realizes the most advanced semiconductor LSI concept as it includes the high-performance feature of the prior art custom-made LSIs and the feature of the prior art microprocessor chip which include its reduced development period and versatility (i.e., the capability a common chip to be transformed into a great variety of exclusive LSIs through changes in software) are to be met by a chip.

The feature of the invention, that the operational speed of an exclusive LSI obtained from the chip of the above embodiment is as excellent as that of the conventional custom LSI (which has the best performance among the existing LSIs), will now be discussed in detail. When the length of the wiring is increased, the floating capacitance of the signal line, particularly the floating capacitance of the extra wiring lines which are held at the same potential as the current paths, is increased correspondingly. This type of capacitance increases the CR-time constant, along with the resistance of the switching elements. The increased CR-time constant is one of the significant causes of the reduction in the operational speed of the device. The LSI chip, according to the invention, is provided with structural measures for reducing or minimizing the CR-time constant. The structural measures for minimizing the CR-time constant include: the preparation of high-speed elements as the functional elements; and the minimization of the number of necessary switching FETs. Owing to these measures, the signal path, along which the output signal from a function block (e.g., MSI 12-1 in FIG. 2) is transmitted to a specific input terminal of a different function block (e.g., MSI 12-2), includes only a single switching FET (e.g., FET 26b). In addition, the average signal transmission line length is less than 2.5 L (where L corresponds to the length of the signal input or output lines of the MSIs shown in FIG. 1). Thus, the signal transmission delay time is reduced or suppressed to improve the operational speed.

The suppression of the delay time in the transmission of a signal between function blocks through the switch matrix greatly contributes to the improvement of the operational speed of the LSI.

The mechanism that causes the delay will next be analyzed with reference to FIGS. 10 and 11. This analysis will hopefully lead to a better understanding of how structural measures are provided on the wiring pattern of the LSI, according to the invention, to improve the operational speed.

Referring to FIG. 10, function block 12-1 includes a buffer circuit having a CMOS structure for the output of a signal. In this example, the output signal from the MSI 12-1 is transmitted through lines 28-1 and 24-1, switching FET 26b and line 22-2 to MSI 12-2. Parasitic capacitances C1, C2 and C3 are formed between the lines 28-1, 24-1 and 22-2, and the ground. Where the width of the wiring line is set to be 1μ, the floating capacitance can be estimated to be 100 fF/mm. There is further a junction capacitance of substantially 3 fF between the source or drain of the switching FET 26b itself and the substrate 10. As an example of the layout of FIG. 1, the average length of the wiring lines 22 was set to 5.6 mm, and the average length of the wiring lines 24 was set to 8 mm. 1,600 FETs were connected to the lines 24, while 800 FETs were connected to the lines 22. Under these conditions, the capacitances C1, C2 and C3 are given as:

$$\left. \begin{array}{l} C1 = 100 \text{ fF/mm} \times 2.6 \text{ mm} = 2.6 \text{ pF} \\ C2 = 100 \text{ fF/mm} \times 8 \text{ mm} + 3 \text{ fF} \times 1{,}600 = 5.6 \text{ pF} \\ C3 = 100 \text{ fF/mm} \times 5.6 \text{ mm} + 3 \text{ fF} \times 800 = 2.96 \text{ pF} \end{array} \right\} \quad (1)$$

When the output signal level changes from low to high, the CMOS buffer noted above can be regarded as a constant current source when the level changes (because the input/output characteristic of the FET has a saturation characteristic). FIG. 11 illustrates an equivalent circuit of a model where there are N fan-outs; the input capacitance of the function block 12-2 is sufficiently low compared to the floating capacitance C3 and is thus ignored. Thus, the CMOS buffer corresponds to a constant current source I in the circuit of FIG. 11. In this case, a voltage V is developed at a terminal 112, which is the signal input terminal of the function block 12-2. Assuming now that the voltage V is V=0 at an initial instant t=0 and that the current I is changed stepwise from 0 to $I_0$, the change in the voltage V with time is expressed as a Laplace transform, $$V(S) = \frac{1}{C_0 C_3 R} \cdot \frac{I(S)}{S\{S + (C_0 + C_3 N)/(C_0 C_3 R)\}} \quad (2)$$

where I(S) is a Laplace transform of a step function and is thus given as, $$I(S) = 1/S \times I_0.$$

The equation (2) is thus rewritten as:

$$V(S) = \frac{I_0}{C_0 C_3 R} \cdot \frac{1}{S^2\{S + (C_0 + C_3 N)/(C_0 C_3 R)\}} \quad (3)$$

where N is the number of fan-outs. A Laplace transform of the equation (3) is:

$$V(t) = \frac{C_0 C_3 R}{(C_0 + C_3 N)^2} \cdot I_0 \left\{ \exp\left(-\frac{C_0 + C_3 N}{C_0 C_3 R}\right) t + \frac{C_0 + C_3 N}{C_0 C_3 R} t - 1 \right\} \quad (4)$$

By substituting 3 as the fan-out number N (it being usual to consider the fan-out number of a standard LSI to be 3 in numerical analysis) and by substituting the specific numerical values in the example of the FIG. 1 chip layout:

$$C_0 = C_1 + C_2 = 5.8\text{pF} = 6\text{pF}$$

$$C_3 = 2.96\text{pF} = 3\text{pF}$$

$$R = 1\text{k}\Omega$$

into equation (4), we can obtain, $$V(t) = 80 \cdot I_0 \left\{ \exp\left(-\frac{t}{1.2 \times 10^{-9}}\right) + \frac{t}{1.2 \times 10^{-9}} - 1 \right\} \quad (5)$$

where the time t is expressed in sec., the current $I_0$ is expressed in A, and the voltage V is expressed in V. Equation (5) can be applied to a model in which the electrical state of the switching FETs is changed and the voltage V at point A is varied between 0 V and 5 V (which corresponds to the source voltage $V_{DD}$). After the voltage V at point A reaches 5 V, the voltage at the terminal 112 is subsequently varied according to the time constant RC of the circuit consisting of the resistance R and capacitance C3. Assuming that the threshold level between the high and low levels of the switching FET 26b in FIG. 10 is 2.5 V, the delay time t in equation (5) can be readily set to be as short as 2 nsec., which is the delay time in the custom LSI. Actually, the inventors could reduce the signal transmission delay time to be shorter than 2 nsec. comparable with that of the custom LSI by increasing the current driving capacity and by increasing the gate width of the MOSFET constituting the CMOS output buffer of each MSI in the above embodiment of the chip (in the range of 74 to 370μ, e.g., 100μ). In this case, due to a restriction on the pattern that an average of 4 output buffers should be provided in each function block or MSI for a total of approximately 40μ in one side (width), the gate of the FET constituting the output buffer was arranged on the substrate, and the source and drain were arranged in a direction crossing the direction of the signal output lines, as shown in FIG. 12. Referring to FIG. 12, there is shown the load p-channel MOSFET Q1 (see FIG. 10) of the output buffer 110. The power source voltage $V_{DD}$ is applied to the drain of the FET Q1. A layer 114 corresponds to the source of the load FET Q1 of the output buffer 110 and also to the drain of the driver n-channel MOSFET Q2 (see FIG. 10) of the output buffer. The output signal is derived from the line 28-1 connected to the layer 114. The driver FET Q2 of the output buffer 110 has its source 116 connected to the ground. With this structure, the drive capacity of the output buffer in each function block could be increased above 37 mA to reduce the signal transmission delay time to be comparable with that in the custom LSI and thus improve the operational speed as noted above.

The use of CMOS transistors as the transistors provided in the programmable LSI as in the above embodiment, does not only permit an improvement in integration but also permits a reduction in the power consumed by the LSI as a whole. In an LSI, from which a desired final function can be obtained by physically setting a changeable wiring relationship among function blocks as mentioned earlier, it is very rare that all the function blocks that are initially prepared on the chip substrate will be used. Thus, a measure for suppressing power consumption in the CMOS transistors included in the non-used function blocks promotes the reduction of the LSI's power consumption. The CMOS transistor consumes power only during the logic level transition. To reduce power consumption, therefore, the input logic level of the logic gates which not in use may be forcibly fixed to either a high or low level. However, where the non-used function blocks are: (1) operable by a system clock like a dynamic shift register and/or (2) operable by an externally supplied clock signal (e.g., a synchronizing clock or system clock) like a C²MOS (Clocked CMOS) transistor, it is necessary to prevent the clock signal from being supplied to the non-used function blocks.

FIG. 13 illustrates an arrangement for reducing power consumption which is added to the programmable LSI as in the above embodiment. In the figure, circles represent switching FETs as in FIG. 1. Clock signal lines 120 and 122 are connected to function block MSIs (e.g., 12-*i*, 12-*j*). A clock line 124, which is connected to a clock source 126 which is formed in the area 39 shown in FIG. 1, extends in the direction of the rows so that it crosses the lines 120 and 122. Line 128 also extends parallel to the line 124 and crosses the lines 120 and 122. Electrical connections between the lines 120 and 122, and between lines 124 and 128 are realized by normally-on type switching FETs 130 and 131, and normally-off type FETs 132 and 133 provided at the crossing points between these lines. The clock line 124 is formed in an exclusive area (not shown) which is defined between the input/output buffer, source line area 34, and function block area 14 on the substrate shown in FIG. 1. In this arrangement, if the MSI 12-*i* is not used, the supply of the clock signal to the non-used MSI 12-*i* can be inhibited by making the FET 130 non-conductive. When this is done, the MSI 12-*i* is held in the dead state so that it will consume substantially no power. In this case, the potential on the clock line of the non-used MSI 12-*i* may be forcibly and stably fixed at either a high or low level by connecting the other column line 128 to the terminal at the source voltage $V_{DD}$ or at the ground potential $V_{SS}$ while making the FET 133, provided at the crossing point between the line 128 and clock line 120 of the non-used MSI 12-*i*, conductive under the control of the decoders 30 and 32. The function blocks include a block which provides a single logic function as a whole like an ALU, and another block which has a plurality of independently operable logic gates, e.g., one having two 4-input NAND gates. The latter function block may be only partly used. In this case, the switching FETs for controlling the supply of the clock signal are preferably provided in groups for each logic gate in order to prevent power from being consumed in the non-used part of the function block.

FIG. 14 shows a function block 12-*k*, which includes a 4-input NAND gate and has four input terminals 136-1 to 136-4. The signal input lines 138-1 to 138-4 leading to the function block 12-*k* cross T-shaped signal output lines 140 as mentioned earlier. A high potential ($V_{DD}$) line 142 and a low potential ($V_{SS}$) line 144 extend such that they cross the signal input lines 138-1 to 138-4. Normally-off type FETs 146 are provided at the crossing points between these lines. Where the 4-input NAND gate in this function block 12-*k* is used as a 2-input NAND gate to realize a desired specification, two input terminals (e.g., 136-3 and 136-4) are not used. In this case, the signal input lines 138-3 and 138-4 connected to the non-used input terminals 136-3 and 136-4 may be forcibly fixed at a high or low potential, for instance by rendering FETs 146a, 146b, 146a' and 146b' conductive, so that non-used terminal should not affect the output of the logical function. Fixing the non-used terminals at the high or low potential in this way is effective for reducing the possibility of erroneous operation or rupture of the pertinent logic gate due to the application of external noise. Where so-called "don't care" terminals occur in a logic gate design, they can be fixed at a high or low potential in the manner as described. The inhibition of the clock signal supply and forced fixing of the non-used input terminals to either a high or low logic level in the case where there is a non-used logic gate as mentioned earlier, not only promotes the reduction of power consumption of the pertinent LSI, but also is effective in improving the reliability of the LSI operation.

FIG. 15 shows a perspective view of a chip package in which the programmable LSI of the above embodiment is packed. The package body 147 has lead terminal pins 148 projecting from its sides and also lead terminal pins 194 projecting upright from its top surface. The lead terminal pins 148 are the ordinary lead terminals provided for the input and output of signals, and supply control signals and the power necessary for the ordinary LSI operation. The lead terminal pins 149 are provided to externally supply connection information to the programmable LSI. With this arrangement, the wiring of the chip can be freely changed while the package is mounted on a circuit board. Further, the lead terminal pins 149 include those connected to internal signal monitoring pads. Thus, it is possible to make logic function checks of the chip while carrying out a change of wiring and also to make such checks on a circuit board on which the programmable LSI is actually mounted, by suitably connecting the internal signal monitoring lead terminal pins to an oscilloscope or logic analyzer (not shown). Thus, the logic designer can very readily debug a logic circuit, which contributes to the efficiency of the logic development.

Figure 16:
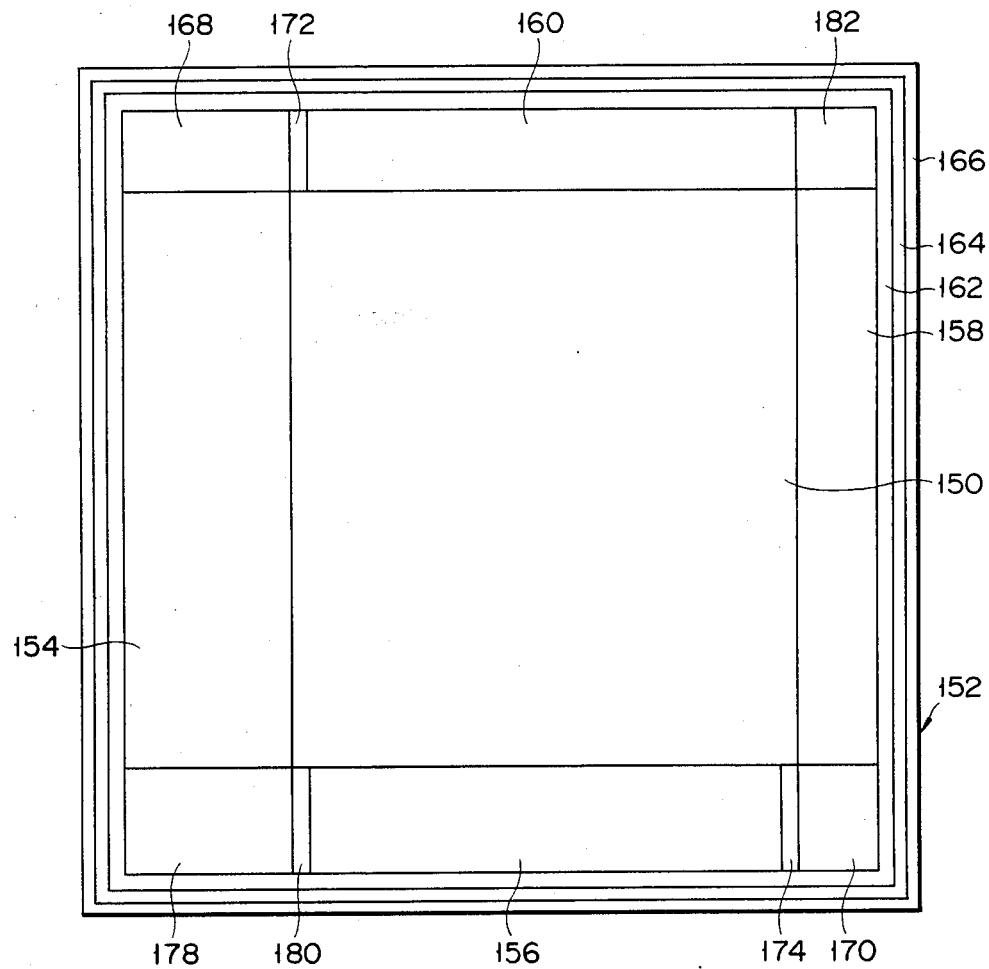
FIG. 16 is a plan view showing a programmable LSI as a second embodiment of the invention.

FIG. 16 shows a plan view of a programmable LSI as a second embodiment of the invention (not drawn to scale). The chip size in this embodiment is set to 10 mm by 10 mm like that in the preceding first embodiment. The chip has a substantially central, rectangular wiring pattern area 150 defined on the surface of a substrate 152. A switch matrix consisting of floating gate type FETs capable of being changeably rendered conductive and nonconductive, is provided in the area 150. MSI scale function blocks are formed in surface areas 154 and 156 adjacent to the two sides of the area 150. Of these areas 154 and 156, the first function block area 154 has a size of 7 mm by 1.8 mm and includes logic gates corresponding to 6.25 kilogates. The second function block area 156 has a size of 6.25 mm by 1 mm and contains logic gates corresponding to 3.75 kilogates. Row and column decoders 158 and 160 for independently and changeably designating the electrical state of the CMOS FETs are formed in areas adjacent to the remaining two sides of the wiring pattern area 150. An input/output buffer and power source line area 162, a pad area 164 and a scribe area 166 are defined such that they surround the areas 150, 154, 156, 158 and 160.

Two corner areas 168 and 170 of the chip are for memory sections (e.g., static RAMs). Static RAM data input and output lines and control lines are formed in an area 172 (having a size of 1 mm by 0.1 mm) which is defined between the column decoder area 160 and static RAM area 168. Lines necessary for the static RAM area 168 are introduced into the switch matrix area 150 through the area 172. The static RAM thus can be accessed by any one of the function blocks in the areas 154 and 156. Data input and output lines, and control lines for the other RAM that is formed in the area 170 are formed in an area 174 defined between the function block area 156 and the static RAM area 170. An 8-bit microprocessor is formed in a third corner area 178. Data input and output lines and control lines for the microprocessor are formed in an area 180. A power source circuit, a clock generator, etc., are formed in the fourth corner area 182.

Figure 17:
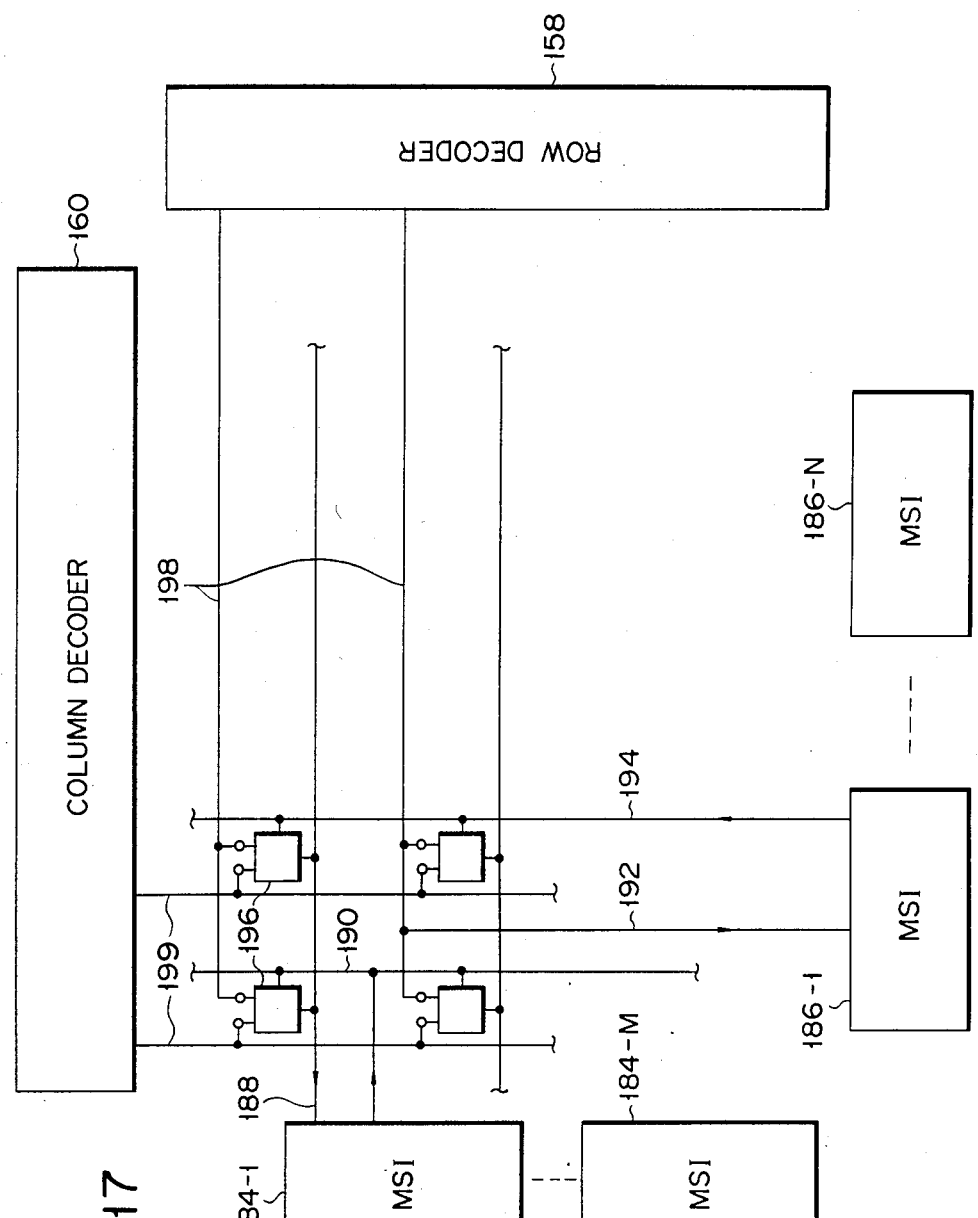
FIG. 17 is a connection diagram modeling the configuration of a circuit of the programmable LSI including MSI function blocks and the wiring pattern connected thereto.

FIG. 17 shows a model of the programmable wiring pattern with a switch matrix that is provided on the chip of FIG. 16. MSIs 184-1 to 184-M, like the function blocks in the first function block area 154 in FIG. 1, are arranged in a row extending in the vertical direction in the figure. MSIs 186-1 to 186-N as the function blocks in the second function block area 156 are arranged in a row extending in the horizontal direction. Signal input lines 188 of the MSI 184-1 extend in the direction of the rows. Signal output lines 190 of the MSI 184-1 are T-shaped lines. The MSI 186-1 in the second function block area has T-shaped signal input lines 192 and signal output lines 194 extending in the direction of the columns. Floating gate type CMOS FETs 196 are provided at the crossing points between the lines 188 and 190, and lines 192 and 194. These switching FETs 196 are connected to the row and column decoders 158 and 160 to control their electrical states in the manner described in the first embodiment. With this arrangement, in one group of MSIs (e.g., MSIs 184-1 to 184-M in the first function block area 154) the signal output lines are T-shaped, while in the other group of MSIs (e.g., MSIs 186-1 to 186-N in the second function block area 156) the signal input lines are T-shaped, thereby improving wiring efficiency, and minimizing the number of necessary FETs and the size of the wiring pattern area 150. Lines 198 are row control lines each connecting one of the two control gates of each FET and the row decoder 158. Lines 199 are column control lines each connecting the other control gate of each FET and the column decoder 160. In this embodiment, 800 row control lines 196, and 1,600 column control lines 198 are provided.

The above construction of the programmable LSI including the RAMs 168 and 170, and microprocessor 178 as the second embodiment of the invention are unique. A desired final function of the LSI can be freely set by designating the electrical (i.e., conductive or nonconductive) state of the individual switching FETs in the switch matrix in the wiring pattern. Designation of the electrical state of the FETs is done by transmitting control signals from the decoders 158 and 160 through the control lines 196 and 198. Data for selecting the necessary FETs is externally supplied to the decoders through pads (not shown). Data for selecting the necessary FETs in the direction of the rows consists of 10 bits, because $2^9 < 800 < 2^{10}$. Data for selecting the necessary FETs in the direction of the columns consists of 11 bits, because $2^{10} < 1,600 < 2^{11}$. For the full selection of the necessary FETs, therefore, 21 pads are necessary. Signal lines are led from these 21 pads not only to the decoders but also to the signal input lines 188 and 192 in the switch matrix in the wiring pattern 150. These signal lines are combined as 8-bit lines, and three latch control lines are provided so that these signal input lines are latched independently. With this arrangement, the FET selecting operation of the row and column decoders 158 and 160 can be controlled by the 8-bit microprocessor. That is, the 8-bit microprocessor 178 can freely and changeably set a given connection of the switch matrix. In a first unique method of use, software programs concerning the self-diagnosis or debugging of the final LSI function are stored in the static RAMs 168 and 170, whereby it is possible to let the chip itself perform the testing of logic gates in the function blocks 184-1 to 184-M, and 186-1 to 186-N, and check for wiring pattern connection designation errors (i.e., FET selection errors) after the final LSI has been produced. In a second unique method, test data may be preliminarily written in a non-rewritable ROM which is substituted for part of the static RAM areas. If this is done as part of the testing done in the manufacturing process, defective FETs and partial functional defects of the function blocks can be readily looked for when a specific LSI is to be produced by the user.

In a third unique method of use, a variety of wiring data for different LSI specifications is preliminarily written in the RAMs 168 and 170. With the structure of this embodiment, 1.28 mega ($1.28 \times 10^6$) switching FETs can be integrated. Even if all the logic gates formed in the function block are used, the wiring data of the type noted can be stored in a single chip if there is a memory area for 50.4 k-bits, and if the average fan-out number of the gates is assumed to be 3. This scale of memory can be readily realized with the RAM noted above. In this way and by giving the microprocessor 178 a suitable software program, one LSI chip can be successively changed to a plurality of LSIs having entirely different functions with the lapse of time under automatic control of the microprocessor 178. Besides, such a plurality of different LSIs will have superior performance, e.g., high operational speed, comparable with that of the custom LSI. This is an entirely novel concept overturning the existing understanding of one LSI function in one LSI chip.

Figure 18A:
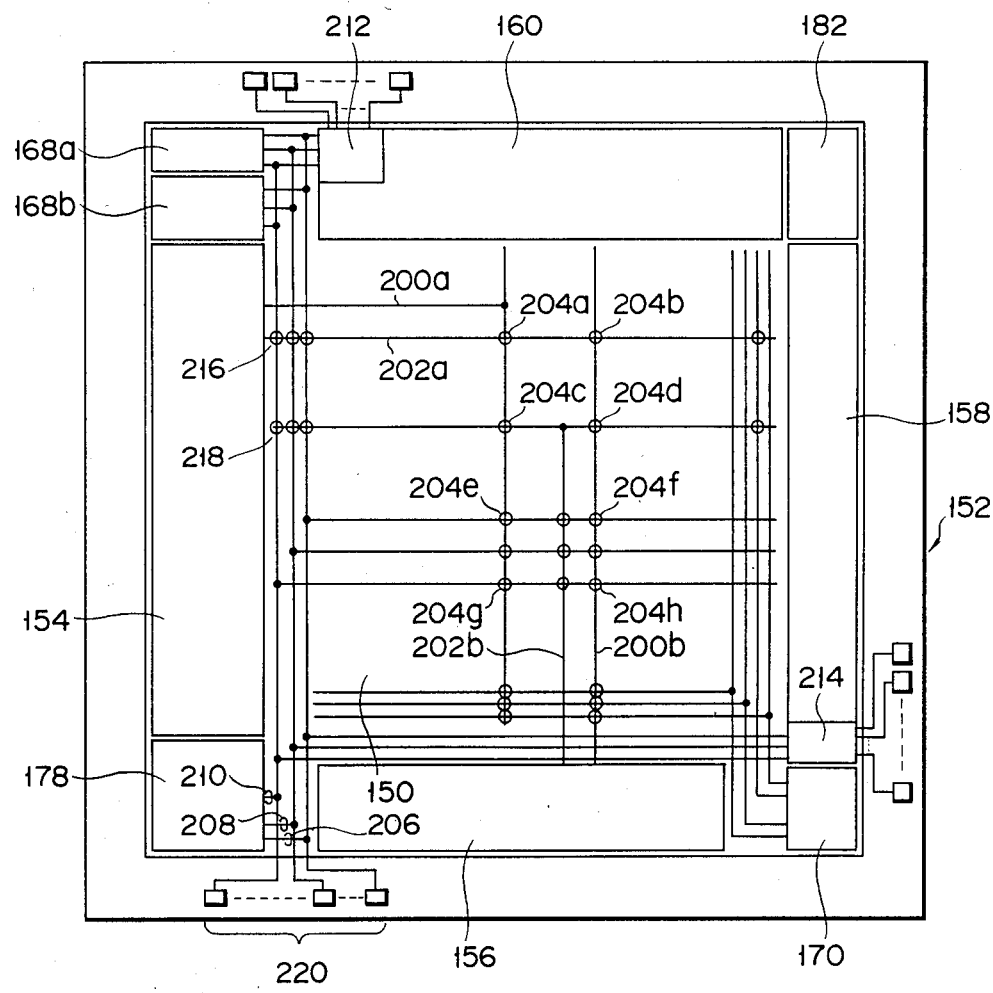
FIG. 18A is a plan view showing a sample chip obtained according to the technical concept of the programmable LSI as the second embodiment of the invention.
Figure 18B:
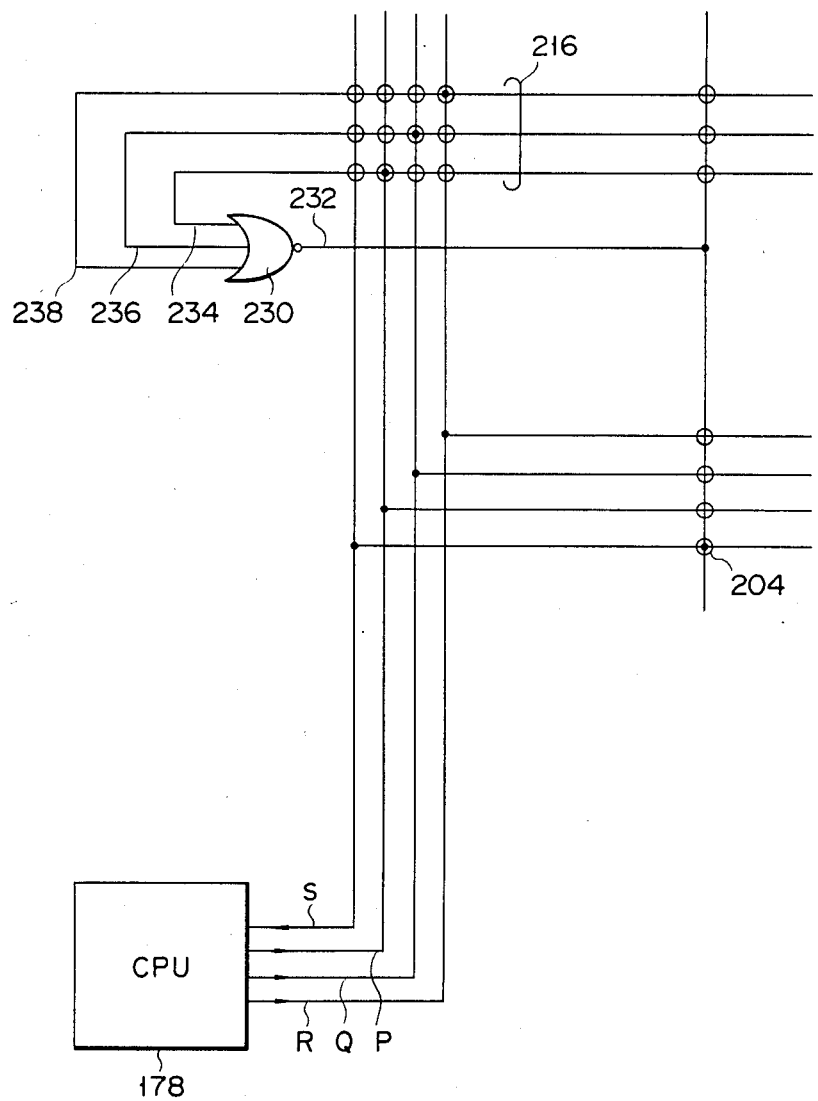
FIG. 18B is a connection diagram showing on an enlarged scale part of wiring pattern of the sample chip of FIG. 18A.

An example of the specific arrangement based on the concept of the second embodiment described above will now be described with reference to FIGS. 18A and 18B. In these figures, parts like those in FIG. 16 are designated by like reference numerals, and their description is omitted. Referring to FIG. 18A, signal output lines 200a and 200b, and input lines 202a and 202b extend from MSI scale function block areas 154 and 156. Switching elements 204a to 204h as shown by the circles are provided at the crossing points of the signal output and input lines. PROM 168a and SRAM 168b, an 8-bit microprocessor 178, a SRAM 170, and a power source and clock generator section 182 are provided at the four corners of the chip.

The microprocessor 178 in this example may be used for a unique operation, which will now be described. An address bus 206, a data bus 208 and a control bus 210 are lead from the microprocessor 178. These buses are led to the PROM 168a and SRAM 168b. Further, these lines are led through a column decoder control circuit 212, a row decoder control circuit 214, and through switching element groups 216 and 218 to a switch matrix area 150, in which signal input and output lines of function blocks are provided so that they can be connected to the desired signal input and output lines of function blocks. In the PROM 168a, programs concerning the basic procedures for the testing of the functions of the function blocks and the basic procedures of control of the column and row decoders are stored. The programs have contents which are determined in the manufacture of the LSI chip and are permanently stored. To execute self-diagnosis of the LSI, the specific content of the diagnosis to be made is externally stored in the SRAM 168b. The address bus 206, data bus 208 and control bus 210 can be directly accessed from the outside of the chip through a pad group 220, and are used to store data in the SRAM 168b. Alternatively, the microprocessor function may be utilized. Then, the microprocessor starts the function block function tests according to the data stored in the SRAM using procedures written in the PROM 168a. The microprocessor then accesses the column decoder control circuit using the address bus 206 and control bus 210 to let the number of the column containing a switch to be turned on to be transmitted to the data bus 208. The column decoder control circuit receives the column number on the data bus and sets a corresponding X control line to a selection potential. The microprocessor then accesses the row decoder control circuit to transmit the number of the row containing the switch to be turned on, thereby setting a corresponding Y control line to a selection potential. Consequently, only a single switch, which belongs to the selected X and Y control lines, is selected and turned on. The sequence of operations described are repeatedly executed to turn on only the desired switches so that the wiring for the testing of the function of a given function block is completed. For example, the wiring as shown in FIG. 18B is completed for testing a 3-input NOR function block. Marks "⊙" in the figure represent the on switches. The output 232 of the 3-input NOR 230 is fed through a switch 204 to a data line S leading to microprocessor 178. Output data lines P, Q and R from the microprocessor are connected to respective three input terminals of the 3-input NOR 230. The microprocessor will determine that the 3-input NOR function block operates normally if it confirms that the following table has been satisfied.

TABLE 2

| P | Q | R | S |
|---|---|---|---|
| 0 | 0 | 0 | 1 |
| 0 | 0 | 1 | 0 |
| 0 | 1 | 0 | 0 |
| 0 | 1 | 1 | 0 |
| 1 | 0 | 0 | 0 |
| 1 | 0 | 1 | 0 |
| 1 | 1 | 0 | 0 |
| 1 | 1 | 1 | 0 |

The microprocessor executes the self-diagnosis test as described above successively for the individual function blocks and, if it finds a faulty function block, it writes the number of this function block and the faulty mode in a redundant memory area of the PROM 168a. The user may recognize the faulty function blocks by reading out the PROM data and by avoiding their use.

To let the LSI chip of this embodiment execute a certain logic function, it is only necessary to determine the switches to be turned on. In other words, the logic function of the LSI is determined absolutely by determining a corresponding combination of the switches to be turned on. Where a total of 1.28 mega switches is provided, the number of bits necessary for specifying one switch is 21 for $2^{20} < 1.28 \times 10^6 < 2^{21}$. With an average fan-out number of 3, considering that an average of three switches must be turned on for each of the 800 signal output lines, the total number of switches to be turned on is $800 \times 3 = 2,400$. All these on switches may be memorized by a memory having 21×2,400=50,400 bits. As an example, two different combinations of on switches that specify respective logic functions may be stored in the RAM 168b. The microprocessor recognizes the switches in the first combination in the manner as described before and turns on these switches through the decoders. After all the switches in the first combination have been turned on, the resultant LSI will perform a first logic operation. When the sole second combination switches are subsequently turned on, if necessary, a second logic function which is different from the first logic operation will be performed. The need for the first logic operation mode to change over to the second may be generated from an internal logic provided in the chip, or it may be generated externally. In either case, such a dynamic logic function can change the LSI hardware on a time division basis, which will contribute to a reduction in the size of the system and an increase in efficiency.

A microprocessor is capable of providing changed logic functions by using only software. In this case, the function of the hardware remains unchanged at any point of time. Therefore, a logic operation is sometimes executed using an excessive amount of hardware. In other words, the microprocessor has redundant hardware. For a series of complicated logic functions, the microprocessor temporarily stores the results of simple logic operations in a register and uses the software to execute different logic operations using the data stored in the register so that the hardware can provide the functions for the logic operations. The time necessary for the logic operations, therefore, is considerably taken up by the sequence of storing data in the register, reading the software and reading out the data from the register. For this reason, the operational speed of the microprocessor is considerably slower than that of random logic, which realizes a series of logic operations by using hardware and hence essentially by operating at a high speed. Such a random logic is only realized when the wiring for a specific LSI is completed. Thus, the speed of a specific logic operation performed by a final function LSI obtained in accordance with the invention is considerably high when compared to that of the same operation performed by a microprocessor. An LSI according to the invention will perform a dynamic logic operation in such a manner that all the available hardware functions are employed at some instant. In other words, so long as a certain instant is concerned, the LSI according to the invention can perform a logic operation that is more complex than that of a microprocessor having the same integration, that is, the LSI according to the invention uses its resources very efficiently.

From the above standpoint, the LSI according to the invention is based on a novel concept entirely different from the way the prior art custom LSI microprocessors are assembled.

Although the present invention has been shown and described with reference to particular embodiments, various changes and modifications which are obvious to a person skilled in the art are deemed to lie within the spirit and scope of the invention.

Figure 19:
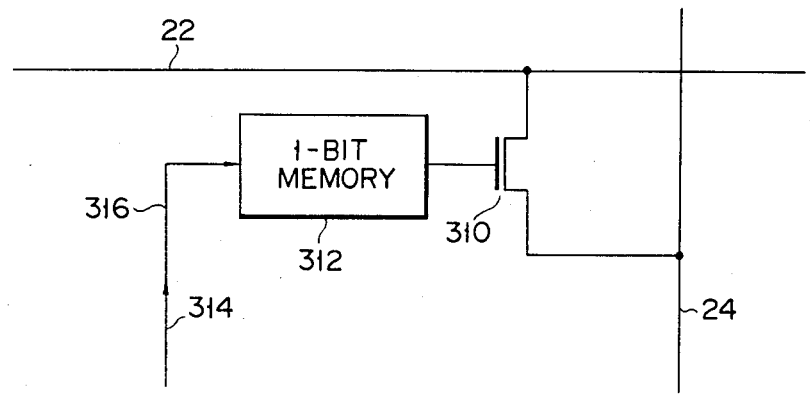
FIG. 19 is a connection diagram showing a modification of the switching transistor used in the switch matrix of the first and second embodiments of the invention.

For example, although floating gate type FETs have been adopted as switching elements provided in the switch matrix, this is by no means limiting. FIG. 19 shows a modification of one switching element. In the case of FIG. 19, one signal input line 22 and one signal output line 24 are electrically connected to each other through an enhancement mode type MOSFET (or Schottky gate type FET or junction type FET) 310. The MOSFET 310 is conductive (or ON) when its gate potential is high, and is nonconductive (or OFF) when the gate potential is low. A 1-bit memory 312 is connected to the gate of the MOSFET 310. The content of the 1-bit memory 312 is designated by a control voltage signal 314 supplied from a line 316. The gate potential on the FET 310 is thus determined by the content of the 1-bit memory 312. For example, the gate potential on the FET 310 is high when the memory content is "1" while it is low when the memory content is "0". With this structure, a potential transfer type switching element is realized.

Figure 20A:
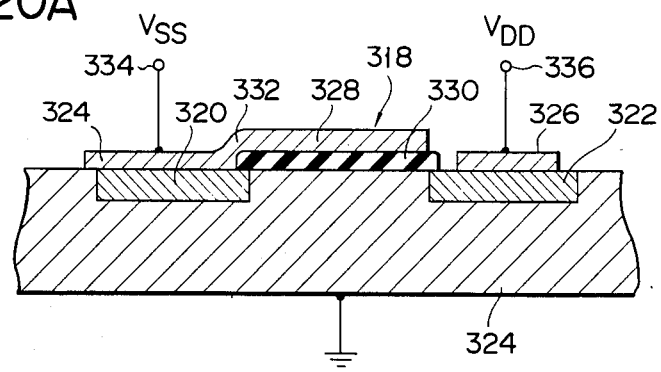
FIG. 20A is a pictorial sectional view showing a reversible semiconductor switch which is normally-off and which is turned on when writing data.

FIG. 20A shows a sectional structure of a reversible semiconductor switch, which is normally-off and which is turned on when writing data in it. According to the embodiments of the invention, by assuming the average logic gate fan-out number, the final function LSI has a greater number of nonconductive switching transistors than conductive switching transistors. Thus, it will be readily understood that the programming concerning the setting of the LSI specification will take less time where transistors that are normally-off are used. Referring to FIG. 20A, the source 320 and drain 322 of an n+ conductivity type are formed in a p-type semiconductor substrate 318. Source and drain electrodes 324 and 326 are formed on the source and drain regions 320 and 322, respectively. A gate electrode 328, which is insulated by an oxide film 330 from the substrate 318, is electrically connected by a connecting metal layer 332 to the source electrode 324. When a positive voltage $V_{DD}$ higher than a predetermined voltage is applied to the gate electrode 328, and when the source electrode 324 and substrate 318 are grounded, current flows between the source and drain. This current flow stems from the fact that with the change of the potential on the drain 322 to a high level, electrons are injected from the source 320 into the substrate 318 to flow into the drain 322 and to be amplified. When the voltage $V_{DD}$ is further increased in this state, the gate electrode 328 and drain electrode 326 are short-circuited. This fact is thought to stem from what is called an electron-migration effect. Once this state is realized, the transistor will remain conductive even if the voltage $V_{DD}$ is subsequently reduced to 0. This is true since the gate 328 and drain 326 are short-circuited and the resistance therebetween is very low. Thus, the electrical state of such a transistor can be designated when the two terminals 334 and 336 are connected to the low and column decoders.

Figure 20B:
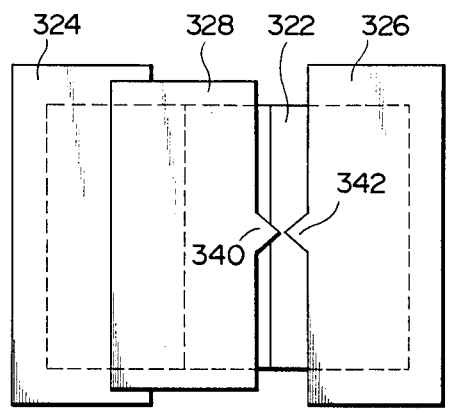
FIG. 20B is a view showing the plan structure of the reversible semiconductor switch of FIG. 20A.

In order to minimize the voltage $V_{DD}$ necessary to turn on the transistor shown in FIG. 20A to stabilize the on state, the gate and drain electrodes 328 and 326 may be provided with a pair of (or a plurality of) projecting layer portions 340 and 342 as shown as the model in FIG. 20B. With this arrangement, when voltage is applied between the source and drain, an electric field concentration is generated in the projecting layer portions 340 and 342 to promote the electron-migration effect noted above.

Figure 21:
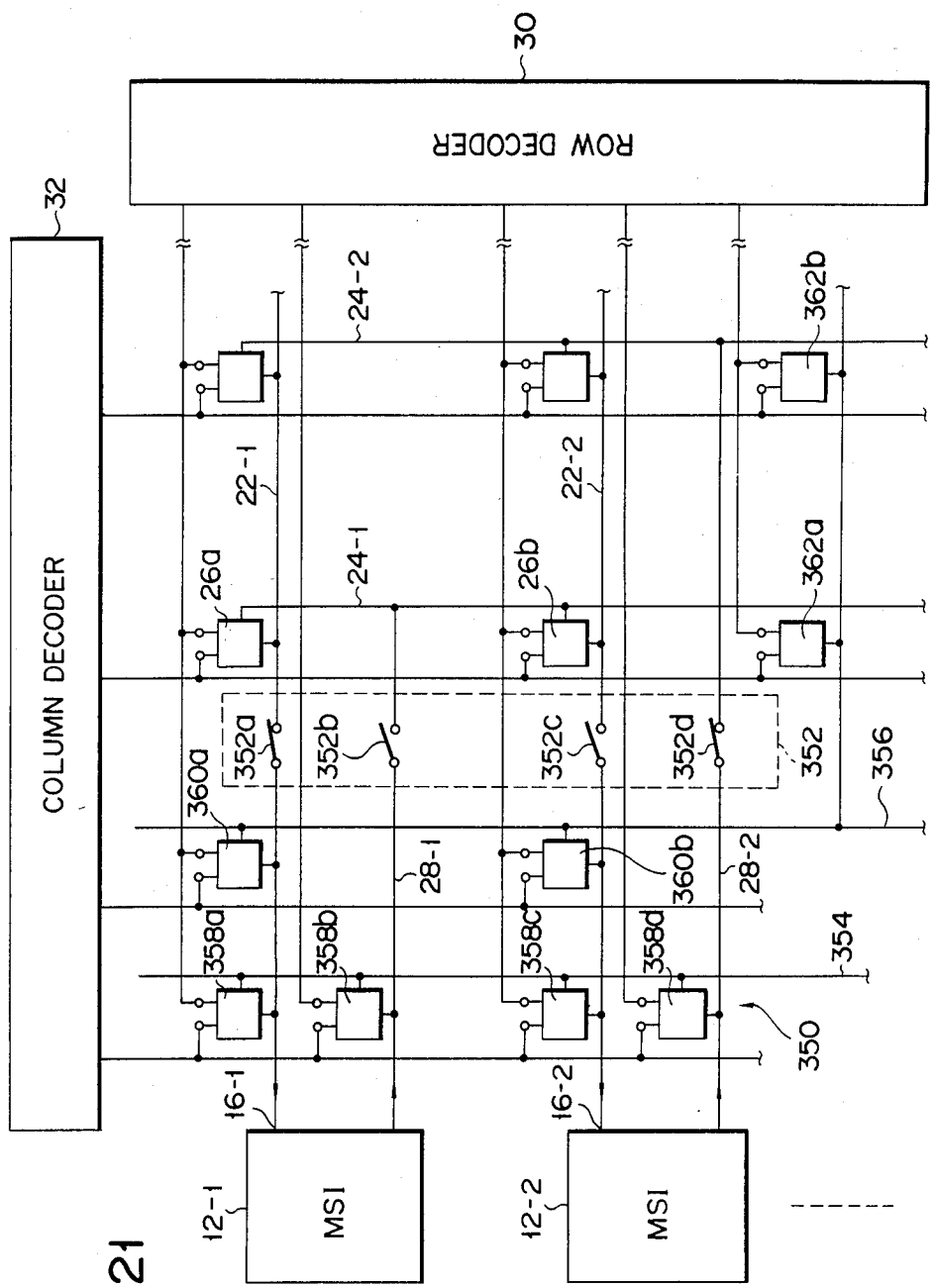
FIG. 21 is a connection diagram showing a circuit configuration of a fault relief arrangement provided on the programmable LSI chip as a measure against the faulty switches produced during manufacture of the LSI chip.

With the programmable LSI according to the invention, 100 kilo to over one mega of switching transistors can be formed as switch elements in the switch matrix of the wiring pattern area. If the entire chip is incapable of use due to the presence of even one faulty switching transistor among these switching transistors, it will lead to an extremely low LSI manufacturing yield and to an undesirably high chip price. An arrangement for relieving such a faulty switch to be described later may be added to the first and second embodiments already described to promote the yield of programmable LSIs according to the invention. FIG. 21 shows the faulty switch relief technique applied to the first embodiment. In the figure, parts like those in FIG. 2 are designated by like reference numerals. A spare switch matrix 350 is provided for MSI scale function blocks 12-1, 12-2 . . . Also, there is provided an FET switch array 352, which consists of normally-on FETs 352a, 352b . . . to be inserted in the signal input and output lines of the function blocks 12-1, 12-2 . . . The spare switch matrix 350 includes a spare line 354 and a T-shaped line 356 which crosses all the signal input and output lines 22-1, 22-2 . . . and 24-1, 24-2 . . . of the function blocks 12-1, 12-2 . . . Floating gate type FETs 358a, 358b . . . , like the normal switching transistors 26a, 26b . . . , are provided at all the crossing points between the spare line 354 and signal input and output lines of the function blocks. Floating gate type FETs 360a, 360b, are provided at the crossing points between the T-shaped line 356 and signal input lines 22-1, 22-2 . . . Floating gate type FETs 362a, 362b . . . are provided at the crossing points between the T-shaped line 356 and T-shaped signal output lines 24-1, 24-2 . . . of the function blocks 12-1, 12-2 . . . The FETs 352a, 352b . . . ; 358a, 358b . . . ; 360a, 360b . . . ; and 362a, 362b . . . are rendered conductive or nonconductive by the row and column decoders 30 and 32.

If it is found that after manufacturing that the switching FET 26b is faulty and is incapable of desirably setting its electrical state, the output signal of the function block 12-1 can not be supplied to the input terminal 16-2 of the function block 12-2. In such a case, the use of the switching FETs 26a, 26b . . . in one column is inhibited, and instead, the spare FETs 358a, 358b . . . are used by turning off the FETs 352b and 352c and by turning on the corresponding spare FETs 358b and 358c under the control of the decoders 30 and 32. By doing so, the same logic design end of supplying the output signal of the function block 12-1 to the input terminal 16-2 of the function block 12-2 can be attained. Further, if software programs for the repair described above are preliminarily stored in the RAMs 168 and 170 shown in FIG. 16, automatic fault relief can be realized within the chip under the control of the microprocessor 178.

Figure 22:
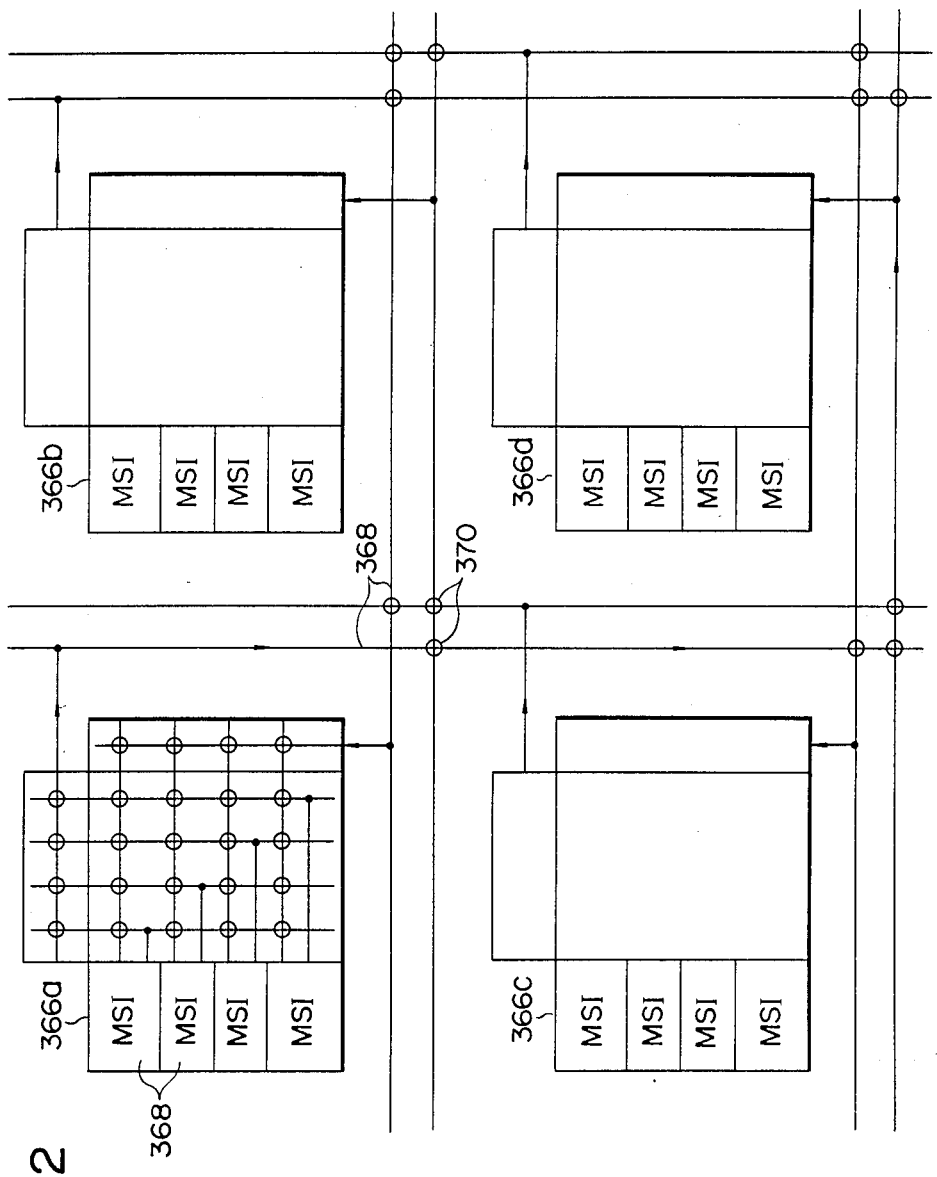
FIG. 22 is a connection diagram showing a modification of the arrangement of the function blocks on chip substrate.

In the above embodiments, the MSI scale function blocks have been collectively provided in the surface areas of the chip substrate adjacent to the sides thereof as shown in FIGS. 8 and 16. However, this is by no means limited, and the function blocks 366a, 366b . . . of the hierarchic wiring structure as described with reference to FIG. 7 (each of which includes a plurality of MSI function blocks), may be on the substrate as shown in FIG. 22. In this case, the wiring lines 368 including the signal input and output lines of the function blocks 366a, 366b . . . along with the switching FETs 370 extend between adjacent function blocks. These signal input and output lines are T-shaped.

Figure 23:
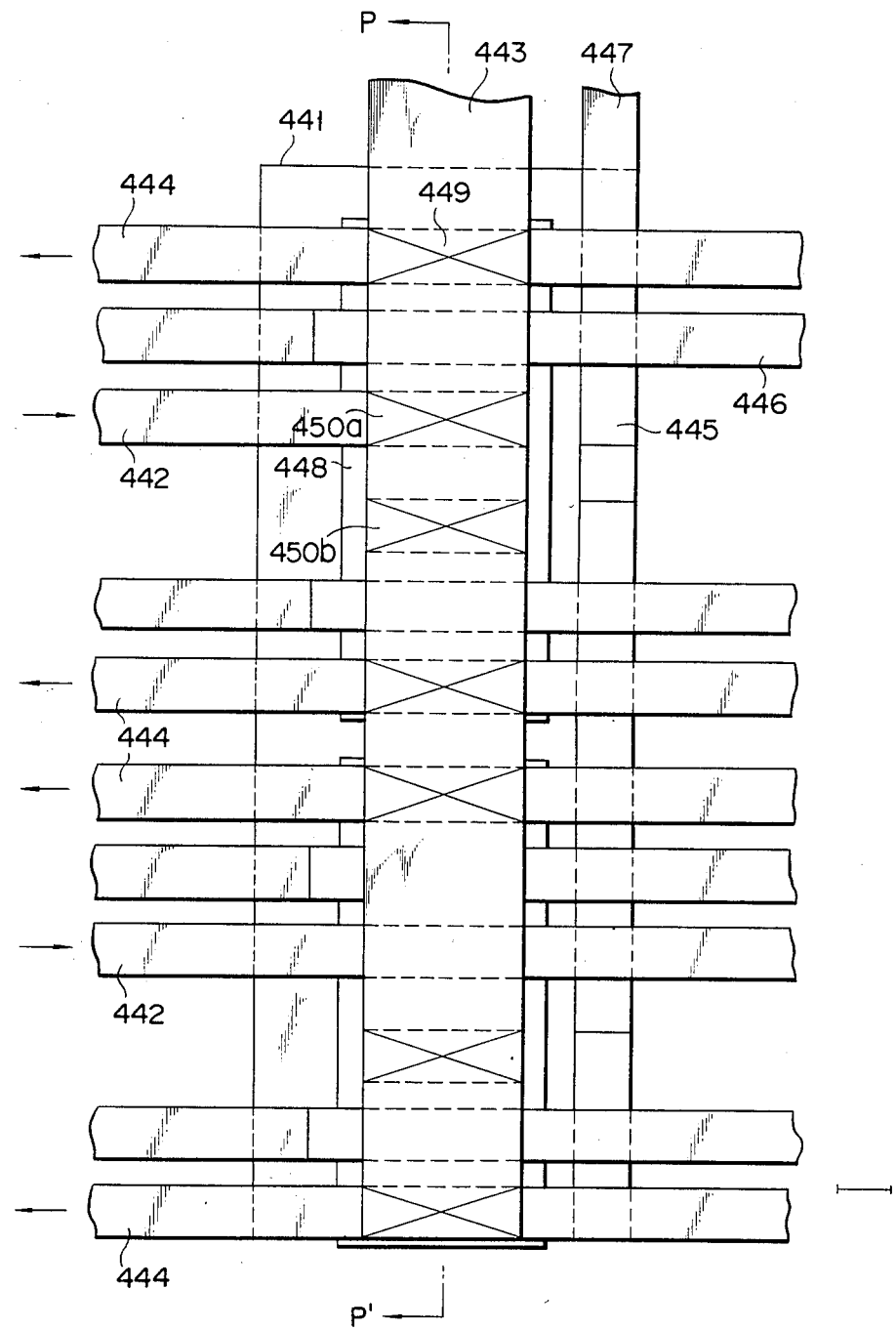
FIG. 23 is a diagram showing a specific example of the plan pattern configuration of the first embodiment of the invention.

FIG. 23 is a plan view showing a switch matrix layout pattern of the first embodiment chip described above. The switches used in this instance are MOSFETs having a floating gate and control gates. Reference numeral 441 designates a unit of a 2-input 1-output structure including two switches. Its size is 10μ by 7μ. Reference numeral 442 designates an output line which is connected to an output line 443. Reference numeral 444 designates an input line. Reference numeral 445 designates a T-shaped floating gate (first polysilicon); 446 designates control lines (Y decoder, second polysilicon); 447 designates a control line (X decoder, third polysilicon); 449 designates input line contact holes (drain sections); 450a designates contact holes between the output line 442 and the diffusion layer 448 (source sections); and 450b designates contact holes between the output lines 443 and the diffusion layer 448. Reference numerals 442 and 444 designate first aluminum layers formed on the polysilicon layer. Reference numeral 443 designates a second aluminum layer. The source section 450b may extend up to the drain section 450a so that the signal output and input lines 443 and 444 are directly connected to each other. The output line 442 may be connected to the output line only at the location of the contact hole 450a.

Figure 24:
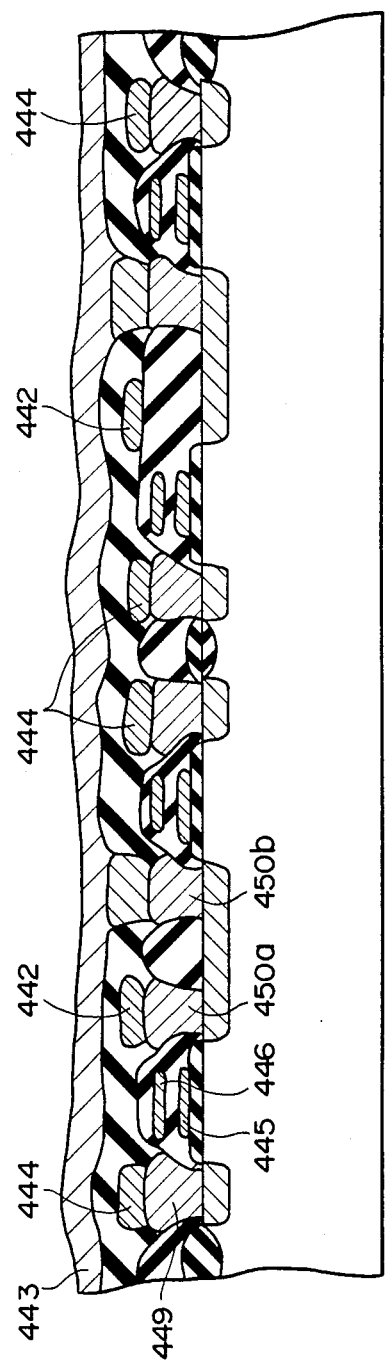
FIG. 24 is a pictorial sectional view taken along line P—P' in FIG. 23.

FIG. 24 shows the sectional structure of the chip taken along line P-P' in the plan view of FIG. 23.

What is claimed is:

1. A semiconductor integrated circuit device comprising:
   (a) a semiconductive substrate;
   (b) a plurality of different kinds of functional elements formed on said substrate, each having a predetermined unit logic function and having at least one input terminal and at least one output terminal;
   (c) first wiring lines formed on an area of said substrate adjacent to said functional elements and extending in a first direction, each said first wiring line being connected to one of the input terminal and the output terminal of the corresponding functional element;
   (d) second wiring lines formed on said substrate area to be electrically insulated from said first wiring lines and extending in a second direction, each said second wiring line being connected to the other of the input terminal and the output terminal of the corresponding functional element, said second wiring lines forming mutually electrically insulated crossing points with said first wiring lines;
   (e) first switching elements provided at said crossing points between said first and second wiring lines and connected to corresponding first and second wiring lines, said first switching elements being capable of changing their own electrical state at least once between conductive and nonconductive states; and
   (f) wiring pattern make-up means, connected to said switching elements, for supplying electric signals necessary for setting given electrical states of said switching elements to set a given mutual wiring of said functional elements through shortest signal transmission paths using said first and second wiring lines, thereby realizing an exclusive custom device function conforming to a given specification.

2. The device according to claim 1, wherein said plurality of different kinds of functional elements is distributed in a plurality of function blocks, each said function block including:
   third wiring lines each of which is connected to one of the input terminal and output terminal of the corresponding functional element provided in each said function block;
   fourth wiring lines provided in each said function block in a state electrically insulated from and crossing said third wiring lines, each said fourth wiring line being connected to the other of the input terminal and output terminal of the corresponding functional element, said fourth wiring lines forming mutually electrically insulated crossing points with said third wiring lines; and second switching elements provided at said second crossing points between said third and fourth wiring lines and connected to corresponding third and fourth wiring lines, said second switching elements being capable of changing their own electrical state at least once between conductive and nonconductive states.

3. The device according to claim 2, wherein said wiring pattern make-up means includes:

decoder means formed on said substrate and connected to said first and second switching elements and capable of setting given electrical states thereof, thereby providing a wiring pattern of a given function of the entire circuit.

4. The device according to claim 3, wherein said decoder means comprises first and second decoders and wherein said semiconductor transistors comprise:

floating gate type field effect transistors each of which has a first control gate connected to said first decoder and a second control gate connected to said second decoder, each said floating gate type of field effect transistor being rendered conductive to changeably connect corresponding first and second wiring lines when electric signals of a predetermined voltage level are applied to its own first and second control gates under the control of said decoders.

5. The device according to claim 4, wherein said first decoder is connected to the first control gates of said field effect transistors to supply a predetermined electric signal to said first control gates and said second decoder is connected to the second control gates of said field effect transistors for supplying a predetermined electric signal to said second control gates, so that one switching element will be rendered conductive in response to said electric signals from said first and second decoders to electrically connect one corresponding first wiring line connected to a signal output terminal of a given functional element to one corresponding second wiring line connected to a signal input terminal of another given functional element, whereby the signal output terminal of said given functional element is connected to a signal input terminal of said another given functional element.

6. The device according to claim 1, wherein:

said first wiring lines are each connected to the input terminal of each said functional element; and said second wiring lines have a plurality of branch lines extending substantially parallel with said first wiring lines and connected to the output terminals of said functional elements.

7. The device according to claim 6, wherein each of said plurality of branch lines of said first wiring lines is connected in a letter "T" fashion to a corresponding first wiring line.

8. The device according to claim 1, wherein:

said plurality of different kinds of functional elements individually have output terminals less in number than the number of input terminals; and said first switching elements each comprise a normally-off semiconductor transistor, which is off in a non-biased state and capable of changing its own electrical state to be on in response to electric signals from said wiring pattern make-up means, thereby electrically connecting one corresponding first wiring line and one corresponding second wiring line.

9. The device according to claim 1, wherein said wiring pattern make-up means includes:

decoder means formed on said substrate and connected to said first switching elements and capable of setting given electrical states thereof, thereby providing a wiring pattern of a given function of the entire circuit.

10. The device according to claim 1, wherein said wiring pattern make-up means comprises:

decoder means formed on said substrate for supplying said first and second wiring lines with particular electric signals corresponding to a mutual wiring pattern which determines a signal transmission among said functional elements in a manner as to realize a customized device function using said functional elements, thereby setting the corresponding electrical states of said switching elements provided on said first and second wiring lines; and microprocessor means formed on said substrate for controlling said decoder means such that said decoder means changes the pattern of generation of electric signals, whereby a plurality of wiring patterns conforming to different device functions is selectively obtained on said substrate, thus promoting the service of said single device substantially as a plurality of different devices.

11. The device according to claim 10, which further comprises:

memory means formed on said substrate for storing software programs for said microprocessor means, whereby the selective formation of said plurality of wiring patterns conforming to different device functions is automatically controlled by said microprocessor means.

12. The device according to claim 1, which further comprises package means for sealing said substrate, said package means including:

a package housing stably accommodating said substrate in a state electrically insulated from the outside, said package housing having a top surface and side walls;

first leads electrically connected to said function blocks for the input and output of signals to and from said function blocks and which projects from said side walls; and second leads electrically connected at least to said decoder means and substantially projecting from said top surface of said package housing, said second leads allowing the user to test the operation of a given device logic function by actually confirming that electric signals have been generated from said second leads after a wiring pattern corresponding to said given device logic function has been obtained under the control of said decoder means.

13. A semiconductor large-scaled integrated circuit device for changeably realizing a plurality of different exclusive function specifications, said device comprising:

(a) a semiconductive substrate;

(b) a plurality of function blocks formed on a first surface area of said substrate, said function block including a plurality of logic function elements each having a predetermined unit logic function and having a plurality of input terminals and at least one output terminal;

(c) first wiring lines formed in a second surface area of said substrate adjacent to said first surface area such that they extend in a first direction, said first wiring lines being respectively connected to the input terminals of said logic function elements;

(d) second wiring lines formed on said second surface area such that they are electrically insulated from said first wiring lines and extend in a second direction crossing said first direction, said second wiring lines being respectively connected to the output terminals of said logic function elements, said second wiring lines forming mutually electrically insulated first crossing points with said first wiring lines and having a plurality of branch lines extending substantially parallel with said first wiring lines and connected to said output terminals of said logic function elements;

(e) first normally-off switching transistors provided at said crossing points between said first and second wiring lines and connected to corresponding first and second wiring lines; and (f) decoder means, formed on a third surface area of said substrate in a manner as to be connected to said first switching transistors, for generating electric signals necessary for individually rendering desired switching transistors conductive under the control of a software program conforming to a customized function of the device to thereby set a corresponding mutual wiring of said logic function elements through signal transmission paths including said first and second wiring lines, whereby one output terminal of a logic function element and one input terminal of another logic function element are electrically connected basically through a single switching transistor and through the shortest signal transmission path using said first and second wiring lines.

14. The device according to claim 13, which further comprises:
spare switching transistors formed on said substrate in addition to said switching transistors;
spare wiring lines connected to said spare switching transistors and electrically insulated from said first and second wiring lines, said spare switching transistors being provided at the crossing points between said spare wiring lines and said first and second wiring lines; and
faulty switch relieving means, provied on said substrate, for electrically disconnecting first and second wiring lines connected to a faulty switching transistor among said switching transistor and for substituting a spare switching transistor among said spare switching transistors using said spare wiring lines.

15. The device according to claim 14, which further comprises:
microprocessor means formed on said substrate, for controlling through software the operations of said decoder means and faulty switch relieving means.

16. The device according to claim 15, which further comprises:
memory means formed on said substrate, for storing operation control software programs for said microprocessor means.

17. The device according to claim 15, wherein said microprocessor means causes said decoder means to supply a plurality of different electric signal patterns respectively representing different wiring patterns conforming to the customized chip specifications selectively to at least said first and second wiring lines, thereby allowing a single integrated circuit device to be employed as a plurality of different integrated circuit devices on a time division basis.

* * * * *